(12) United States Patent
Parkinson et al.

(10) Patent No.: US 10,885,991 B2
(45) Date of Patent: Jan. 5, 2021

(54) DATA REWRITE DURING REFRESH WINDOW

(71) Applicant: SanDisk Technologies LLC, Addison, TX (US)

(72) Inventors: Ward Parkinson, Boise, ID (US); Martin Hassner, Mountain View, CA (US); Nathan Franklin, Belmont, CA (US); Christopher Petti, Mountain View, CA (US)

(73) Assignee: SanDisk Technologies LLC, Addison, TX (US)

( * ) Notice: Subject to any disclaimer, the term of this patent is extended or adjusted under 35 U.S.C. 154(b) by 29 days.

(21) Appl. No.: 16/359,846

(22) Filed: Mar. 20, 2019

(65) Prior Publication Data

US 2019/0221273 A1 Jul. 18, 2019

Related U.S. Application Data

(63) Continuation-in-part of application No. 15/945,699, filed on Apr. 4, 2018, now Pat. No. 10,545,692.
(Continued)

(51) Int. Cl.
*G11C 16/34* (2006.01)
*G06F 3/06* (2006.01)
(Continued)

(52) U.S. Cl.
CPC ........ *G11C 16/3431* (2013.01); *G06F 3/0611* (2013.01); *G06F 3/0619* (2013.01); *G06F 3/0625* (2013.01); *G06F 3/0652* (2013.01);
*G06F 3/0656* (2013.01); *G06F 3/0679* (2013.01); *G06F 11/08* (2013.01);
(Continued)

(58) Field of Classification Search
CPC .... G06F 3/0611; G06F 3/0619; G06F 3/0625; G06F 3/0652; G06F 3/0656; G06F 3/0679
See application file for complete search history.

(56) References Cited

U.S. PATENT DOCUMENTS

2003/0204669 A1 10/2003 Ranganathan et al.
2007/0067556 A1* 3/2007 Dixon .................... G11C 29/44
  711/106

(Continued)

OTHER PUBLICATIONS

Office Action dated Jul. 11, 2019 in U.S. Appl. No. 15/945,699.
(Continued)

*Primary Examiner* — Ryan Bertram
(74) *Attorney, Agent, or Firm* — Vierra Magen Marcus LLP

(57) ABSTRACT

Apparatuses, systems, methods, and computer program products are disclosed for data rewrite operations. A non-volatile memory device comprises a non-volatile memory medium. A non-volatile memory device is configured to determine an error metric for a non-volatile memory medium in response to a read request for the non-volatile memory medium. A non-volatile memory device is configured to receive a refresh command from a controller over a bus. A non-volatile memory device is configured to rewrite data from a non-volatile memory medium during a pre-defined time period after receiving a refresh command in response to an error metric satisfying an error threshold.

18 Claims, 11 Drawing Sheets

Related U.S. Application Data

(60) Provisional application No. 62/481,300, filed on Apr. 4, 2017.

(51) Int. Cl.
*G06F 11/08* (2006.01)
*G06F 12/02* (2006.01)

(52) U.S. Cl.
CPC .. *G06F 12/0246* (2013.01); *G06F 2212/1041* (2013.01); *G06F 2212/7202* (2013.01); *G06F 2212/7205* (2013.01)

(56) References Cited

U.S. PATENT DOCUMENTS

| | | | |
|---|---|---|---|
| 2010/0313084 A1* | 12/2010 | Hida | G06F 11/1068 714/704 |
| 2013/0185606 A1 | 7/2013 | Fai | |
| 2013/0238836 A1* | 9/2013 | Suzuki | G11C 16/3495 711/103 |
| 2014/0146605 A1* | 5/2014 | Yang | G06F 3/0619 365/185.03 |
| 2014/0173180 A1* | 6/2014 | D'Abreu | G11C 16/3431 711/103 |
| 2014/0189421 A1* | 7/2014 | Werner | G06F 3/0688 714/6.21 |
| 2015/0058535 A1* | 2/2015 | Lasser | G06F 12/0246 711/103 |
| 2015/0268871 A1* | 9/2015 | Shu | G06F 3/064 711/103 |
| 2015/0339069 A1* | 11/2015 | Nishikubo | G06F 3/064 711/103 |
| 2015/0355845 A1* | 12/2015 | Lee | G06F 3/0616 711/103 |
| 2016/0132253 A1 | 5/2016 | Chiu | |
| 2016/0342458 A1* | 11/2016 | Cai | G11C 16/349 |
| 2017/0052739 A1* | 2/2017 | Terada | G06F 3/0659 |
| 2017/0220293 A1 | 8/2017 | Kim et al. | |
| 2017/0262197 A1* | 9/2017 | Tan | G06F 3/065 |
| 2017/0277448 A1* | 9/2017 | Khoueir | G06F 3/0653 |
| 2017/0286311 A1* | 10/2017 | Juenemann | G06F 12/023 |
| 2017/0329724 A1* | 11/2017 | Terada | G06F 11/22 |
| 2017/0365352 A1* | 12/2017 | Shin | G11C 16/3418 |
| 2018/0246817 A1 | 8/2018 | Feehrer et al. | |
| 2018/0285007 A1 | 10/2018 | Franklin et al. | |

OTHER PUBLICATIONS

Response to Office Action filed Oct. 7, 2019 in U.S. Appl. No. 15/945,699.
Notice of Allowance and Fee(s) Due dated Oct. 22, 2019 in U.S. Appl. No. 15/945,699.
Joosung Yun et al., Dynamic Wear Leveling for Phase-Change Memories With Endurance Variations, IEEE Transactions on Very Large Scale Integration (VLSI) Systems, vol. 23, No. 9, Sep. 2015.
Burton H. Bloom, Space/Time Trade-offs in Hash Coding with Allowable Errors, Communications of the ACM, vol. 13, No. 7, Jul. 1970.

* cited by examiner

700

| /CS 702 | /RAS 704 | /CAS 706 | /WE 708 | Address 710 | Command 712 |
|---|---|---|---|---|---|
| H | - | - | - | - | Command Inhibit (No Op) 712a |
| L | H | H | H | - | No Op 712b |
| L | H | H | L | - | Burst Terminate 712c |
| L | H | L | H | Column | Read Column from Active Row 712d |
| L | H | L | L | Column | Write Column to Active Row 712e |
| L | L | H | H | Row | Activate Row for Read/Write 712f |
| L | L | H | L | - | Precharge/Deactivate Row 712g |
| L | L | L | H | - | Refresh 712h |
| L | L | L | L | Mode | Load Mode Register 712i |

FIG. 7

DATA REWRITE DURING REFRESH WINDOW

CROSS-REFERENCES TO RELATED APPLICATIONS

This application is a continuation in part of U.S. patent application Ser. No. 15/945,699 entitled "MEMORY MAINTENANCE OPERATIONS DURING REFRESH WINDOW" and filed on Apr. 4, 2018 for Nathan Franklin, et al., which claims the benefit of U.S. Provisional Patent Application No. 62/481,300 entitled "MEMORY MAINTENANCE OPERATIONS DURING REFRESH WINDOW" and filed on Apr. 4, 2017 for Nathan Franklin, et al., both of which are incorporated herein by reference in their entirety, for all purposes.

TECHNICAL FIELD

The present disclosure, in various embodiments, relates to data integrity for non-volatile memory and more particularly relates to data rewrite performed during a refresh window.

BACKGROUND

As the speed of memory devices increases, it becomes increasingly important to provide or maintain synchronous operation. Non-volatile memory devices, however, typically have background maintenance operations that delay other memory operations, preventing synchronous operation for non-volatile memory devices.

SUMMARY

Apparatuses are presented for data rewrite operations during a refresh window. In one embodiment, a non-volatile memory device comprises a non-volatile memory medium. A non-volatile memory device, in certain embodiments, is configured to determine an error metric for a non-volatile memory medium in response to a read request for the non-volatile memory medium. In one embodiment, a non-volatile memory device is configured to receive a refresh command from a controller over a bus. A non-volatile memory device, in some embodiments, is configured to rewrite data from a non-volatile memory medium during a predefined time period after receiving a refresh command in response to an error metric satisfying an error threshold.

Other apparatuses are presented for data rewrite operations during a refresh window. In one embodiment, an apparatus includes means for periodically receiving refresh triggers at a non-volatile memory over a bus. An apparatus, in some embodiments, includes means for determining an error metric for an error correcting code ("ECC") codeword in response to a read request for the ECC codeword. In certain embodiments, an apparatus includes means for selectively rewriting an ECC codeword to a non-volatile memory exclusively during a predefined time period after receiving one or more refresh triggers in response to an error metric satisfying an error threshold.

Methods are presented for data rewrite operations during a refresh window. In certain embodiments, a method includes reading data from a region of a non-volatile memory. A method, in some embodiments, includes correcting errors in read data. In one embodiment, a method includes buffering error corrected read data in response to a number of corrected errors satisfying an error threshold. In one embodiment, a method includes writing buffered error corrected read data back to a same region of a non-volatile memory in response to receiving a refresh command at the non-volatile memory from a controller over a bus.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which:

FIG. 7 is a schematic block diagram illustrating embodiments of memory commands;

DETAILED DESCRIPTION

Figure 1:
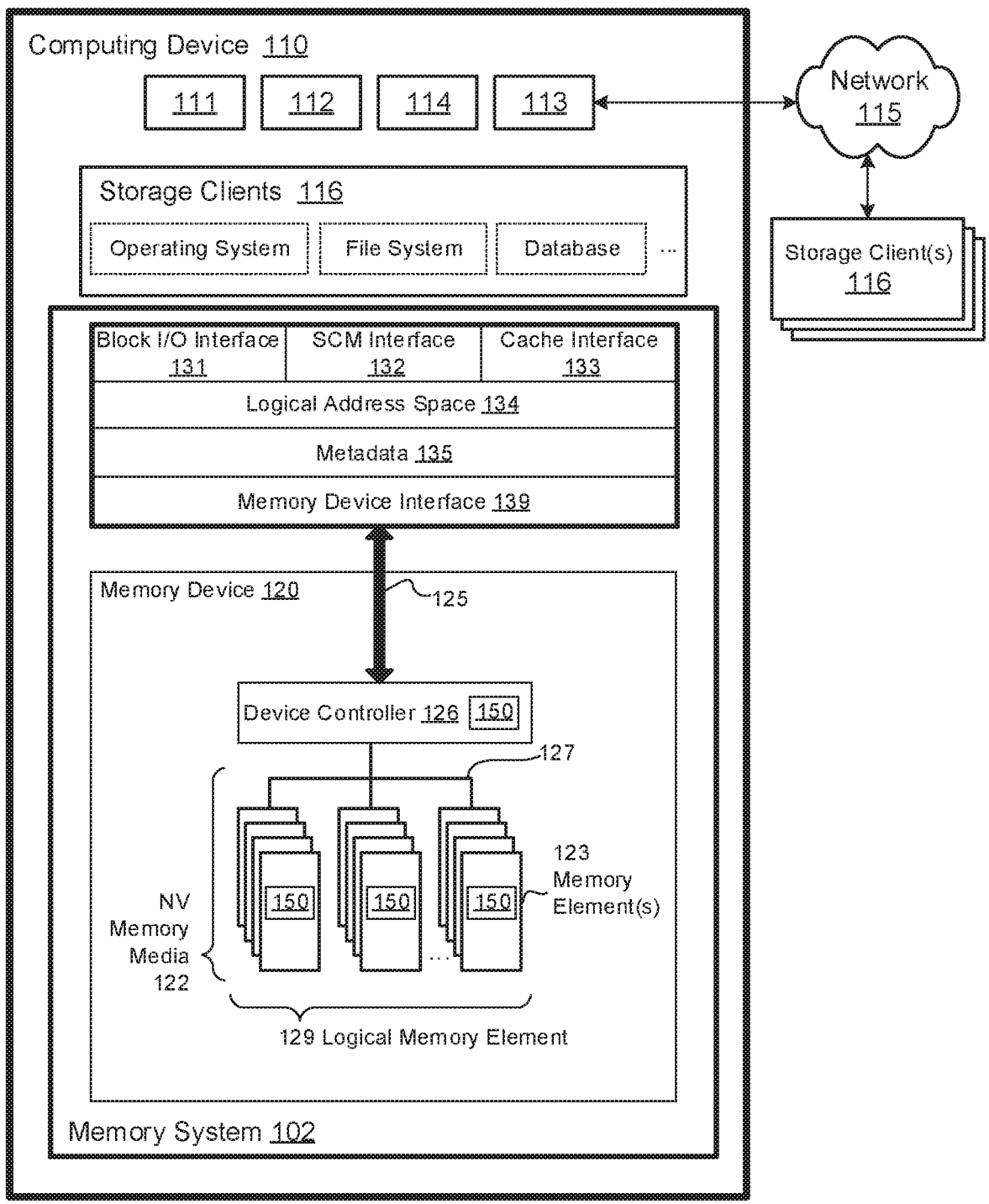
FIG. 1 is a schematic block diagram of one embodiment of a system for data rewrite operations during a refresh window.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures.

Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1 is a block diagram of one embodiment of a system 100 for data rewrite and/or other memory maintenance operations during a refresh window. The system 100 comprises one or more maintenance components 150 for a non-volatile and/or volatile memory device 120. A maintenance component 150 may be part of a non-volatile and/or volatile memory element 123, and may be in communication with a non-volatile and/or volatile memory media controller 126, a device driver, or the like. In some embodiments, a maintenance component 150 may at least partially operate on and/or in communication with a non-volatile and/or volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or memory controller 126 to a communication network 115, such as an Internet Protocol (IP) network, a Storage Area Network (SAN), wireless network, wired network, or the like.

The memory device 120, in various embodiments, may be disposed in one or more different locations relative to the computing device 110. In one embodiment, the memory device 120 comprises one or more non-volatile and/or volatile memory elements 123, such as semiconductor chips or packages or other integrated circuit devices disposed on one or more printed circuit boards, storage housings, and/or other mechanical and/or electrical support structures. For example, the memory device 120 may comprise one or more direct inline memory module (DIMM) cards, one or more expansion cards and/or daughter cards, a memory card, a universal serial bus (USB) drive, a solid-state-drive (SSD) or other hard drive device, and/or may have another memory and/or storage form factor. The memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer readable storage medium 114. The computer readable storage medium 114 may comprise executable instructions configured to cause the computing device 110 (e.g., processor 111) to perform steps of one or more of the methods disclosed herein. Alternatively, or in addition, the maintenance component 150 may include one or more computer readable instructions stored on the non-transitory storage medium 114.

The non-volatile and/or volatile memory system 102, in the depicted embodiment, includes one or more maintenance components 150. In certain embodiments, as described in greater detail below, access to memory cells of a non-volatile memory element 123 may be controlled by one or more selectors or other switches, so that certain memory cells may be selected for a memory operation while others are unselected. A selector may minimize disturb effects of a memory operation on neighboring, unselected memory cells. However, certain selectors, such as ovonic threshold switch (OTS) selectors, or the like, may provide a pop or spike of current to a memory cell, in response to a selector being activated for a memory operation.

The pop or spike of current, in some embodiments, may unintentionally program and/or disturb a state of the memory cell. Over time, as multiple memory operations are performed on a memory cell, the disturb effects may be cumulative, causing an increasing number of errors as memory operations are successively performed. Eventually, in certain embodiments, a number of errors in data of a location/region of memory may exceed a number of errors that are correctable for the data. For example, if a number of errors in an error correcting code (ECC) codeword of data exceed a maximum correctable number of errors for the ECC codeword, the error may be uncorrectable, or the like (e.g., if a 7 bit ECC system is used, the maximum correctable number of errors is 7, or the like).

A maintenance component 150, in one embodiment, is configured to perform one or more data rewrite operations and/or other memory maintenance operations on one or more memory elements 123, to reduce and/or eliminate uncorrectable errors due to cumulative disturb effects, or the like. In some embodiments, in order to avoid delaying user memory operations, a maintenance component 150 may perform data rewrite and/or other maintenance operations during a refresh window or other predefined time period after a refresh command and/or request (e.g., from a memory controller, a device controller 126, from a device driver, from a host computing device 110, from a processor 111, from a storage client 116, or the like). A maintenance component 150, in certain embodiments, may repurpose, reuse, and/or override a refresh command from a protocol and/or specification for a different type of memory (e.g., a volatile memory standard, a dynamic random access memory (DRAM) standard, a Joint Electron Device Engineering Council (JEDEC) standard, a JEDEC double data rate (DDR) three (DDR3) synchronous DRAM (SDRAM) standard, a JEDEC DDR4 SDRAM standard, or the like) to trigger a non-volatile data rewrite and/or other memory maintenance operation, to maintain compatibility with the protocol and/or specification but for a different type of memory (e.g., maintaining legacy compatibility).

By performing a data rewrite operation and/or other memory maintenance operation or portion thereof in response to a refresh command, instead of, or in addition to, performing the data rewrite operation and/or other memory maintenance operation in the background, in some embodiments, a maintenance component 150 may allow a non-volatile memory element 123 and/or a non-volatile memory device 120 to operate synchronously (e.g., responding to a storage request such as a read or write request with little or no delay from performing a background data rewrite operation and/or other memory maintenance operation and/or otherwise communicating synchronously with a host 110, a processor 111, or the like). Synchronous operation of a non-volatile memory device 120 and/or a non-volatile memory element 123, as used herein, comprises a non-volatile memory device 120 and/or a non-volatile memory element 123 recognizing control inputs (e.g., commands, data, addresses, or the like) in response to an external clock input (e.g., over a memory bus 125 or the like).

In certain embodiments, a non-volatile memory device 120 and/or a non-volatile memory element 123 may satisfy and/or respond to a command synchronously as part of a same transaction on the memory bus 125 (e.g., using an uninterrupted set of one or more clock cycles on the memory bus 125 between receiving a command and acknowledging and/or providing data of the command). For example, in embodiments where a non-volatile memory device 120 and/or a non-volatile memory element 123 operate synchronously, a memory controller for a processor 111 may receive read data or the like substantially immediately (e.g., within a predefined number of clock cycles and/or clock edges), rather than polling the non-volatile memory device 120 and/or the non-volatile memory element 123 for the read data at a later time. While performing data rewrite operations and/or other memory maintenance operations in the background (e.g., before and/or during performing a read and/or write operation for a storage client 116 or the like) may prevent synchronous operation of a non-volatile memory device 120 and/or a non-volatile memory element 123, performing data rewrite operations and/or other memory maintenance operations during a refresh window or other predefined time period after receiving a refresh command may enable synchronous operation.

For example, a volatile memory refresh operation may be performed periodically (e.g., about every 64 ms for each volatile memory cell, or the like) in response to a refresh command from a host memory controller (e.g., sent by the host memory controller about every 7.8 us or the like, rotating through portions of the volatile memory cells such that they are all periodically refreshed). After the refresh command, the volatile memory may be unavailable for a refresh window or time period (e.g., between about 160 ns and 350 ns, or the like) during which data is read from and written back to the volatile memory cells to preserve the data, either reading and writing the data within the memory element 123 or reading the data our from the memory element 123 to a controller 126 and back to the memory element 123.

Without refresh operations reading and rewriting data at predefined intervals, volatile memory such as DRAM, SDRAM, or the like may lose stored data over time (e.g., as electric charge leaks from a capacitive volatile memory cell, or the like). Non-volatile memory, however, may not require refreshing, and least not as frequently as volatile memory. However, for compatibility with the same host memory controller and/or refresh command, in certain embodiments, a maintenance component 150 may perform one or more data rewrite operations and/or other memory maintenance operations or a portion thereof on non-volatile memory cells of a non-volatile memory medium 122 of one or more non-volatile memory elements 123 in response to a refresh command. For example, a maintenance component 150 may instead, or on occasion, use or repurpose some or all of the refresh commands to perform a different maintenance operation for a type of memory medium 122 that doesn't require a volatile memory refresh operation such as storage class memory or other non-volatile memory, and/or may perform a different type of maintenance operation for a memory medium 122 that does require a volatile memory refresh operation (e.g., in addition to a volatile memory refresh operation), or the like.

A maintenance operation may comprise a management and/or system operation for a memory medium 122 (e.g., that is not in response to a read and/or write request from a storage client 116 or the like). In one embodiment, a maintenance operation comprises a wear leveling operation, such as moving and/or remapping a region of memory (e.g., logically remapping), moving data from one region of memory to another, or the like.

In a further embodiment, a maintenance operation comprises a data rewrite operation. A data rewrite operation, as used herein, comprises one or more operations for writing data previously stored by a non-volatile memory medium 122 back to the same non-volatile memory medium 122 (e.g., to the same location/region, to a different location/region, or the like). For example, a data rewrite operation may rewrite data to the same location/region or to a different location/region of memory to prevent data loss, may rotate data within a single memory location/region, or the like. A data rewrite operation may be part of and/or include a garbage collection operation and/or a storage capacity recovery operation to move valid data to a different region of memory while recovering invalid data and/or correcting data errors using on or off-chip error correction, or the like. In some embodiments, a data rewrite operation may be in response to an error metric satisfying an error threshold, such as during and/or due to a predefined temperature condition, a predefined time condition, a predefined read disturb condition, a predefined write disturb condition, or the like.

In response to an error threshold for an ECC codeword being satisfied during a read operation for the ECC codeword, in certain embodiments a maintenance component 150 may trip a signal or another trigger to buffer/store the ECC codeword along with its associated address. During the next refresh window, the maintenance component 150 may pause one or more other maintenance operations and may rewrite the buffered read data which has already passed through ECC correction, along with associated ECC parity bits, back to the associated address stored with the buffered data. The trip signal or other trigger may be cleared after all stored read addresses are written back so that subsequent refresh windows may be normally used for other maintenance operations (e.g., until another ECC codeword trips past the error threshold, or the like).

A maintenance operation, in certain embodiments, may comprise a replacement operation such as replacing and/or retiring a region of memory (e.g., failing and/or near failing memory cells), logically remapping spare or extra storage capacity to replace a region of memory, or the like. A region of memory and/or a location in memory may comprise a group of one or more memory cells, such as a memory element 123, an error correcting code (ECC) codeword, a page, a block (e.g., an erase block, a block of a predefined size, or the like), a word line, a bit line, a page, a chip, a die, a die plane, or the like.

A maintenance component 150 may divide or break up one or more data rewrite operations and/or other memory maintenance operations (e.g., non-volatile data rewrite and/or other memory maintenance operations) to fit within a refresh window of a refresh command (e.g., a volatile memory refresh command). For example, a maintenance component 150 may read data during a refresh window after a first refresh command. The maintenance component 150 may, in the same or a subsequent refresh window, buffer the data, and/or write the data (e.g., to the same memory region, to a different memory region, swap and/or rotate the data, or the like) during a subsequent refresh window after a subsequent refresh command. Performing data rewrite operations and/or other memory maintenance operations only during a refresh window after a refresh command, in certain embodiments, may allow a memory element 123 to operate synchronously and/or with minimal latency for normal read and/or write operations (e.g., without delay of read or write commands caused by performance of a data rewrite operation and/or other memory maintenance operation in the background, or the like).

In certain embodiments, a maintenance component 150 may dynamically select one of a plurality of different types of maintenance operations to perform during a refresh window in response to receiving a refresh command. In one embodiment, a maintenance component 150 may perform at least a portion of multiple types of maintenance operations during the same refresh window after a single refresh command. For example, a refresh command may comprise a generic refresh command that does not specify a type of maintenance operation, on which memory cells to perform a maintenance operation (e.g., a refresh command with no address and/or identifier), or the like and the maintenance component 150 may dynamically manage performance of maintenance operations in response to refresh commands.

In certain embodiments, a maintenance component 150 may allow a refresh command to be sent less frequently than is specified for a volatile memory refresh command (e.g., because non-volatile memory media 122 does not require a volatile memory refresh, because the maintenance component 150 may complete data rewrite operations and/or other memory maintenance operations in less time than a volatile memory refresh, to conserve power, or the like). In a further embodiment, a maintenance component 150 may allow custom and/or flexible timing of refresh commands (e.g., one refresh for every N write and/or read commands, sending/receiving a plurality of refresh commands at once and/or in a group, an extended or longer refresh window time period if allowed and/or authorized by a host, or the like). In one embodiment, a maintenance component 150 may selectively skip performing any, or one or more data rewrite operations and/or other memory maintenance operations in response to receiving a refresh command (e.g., because non-volatile memory media 122 does not require a volatile memory refresh, because the maintenance component 150 may complete data rewrite operations and/or other memory maintenance operations in less time than a volatile memory refresh, to conserve power, preserve remaining battery life, or the like).

In one embodiment, a maintenance component 150 may comprise logic hardware of a non-volatile and/or volatile memory element 123, other programmable logic, firmware for a non-volatile and/or volatile memory element 123, microcode for execution by a non-volatile and/or volatile memory element 123, or the like. In another embodiment, a maintenance component 150 may comprise executable software code, stored on a computer readable storage medium for execution by logic hardware of a non-volatile and/or volatile memory element 123. In a further embodiment, a maintenance component 150 may include a combination of both executable software code and logic hardware.

In one embodiment, the maintenance component 150 is configured to receive storage requests and/or refresh commands from a memory controller (e.g., for a processor 111), a device driver or other executable application via buses 125, 127, a memory media controller 126, or the like. The maintenance component 150 may be further configured to transfer data to/from a memory controller, a device driver and/or storage client 116, or the like via the bus 125. Accordingly, a maintenance component 150, in some embodiments, may comprise and/or be in communication with one or more direct memory access (DMA) modules, remote DMA modules, bus controllers, bridges, buffers, or the like to facilitate the transfer of storage requests and/or associated data. In another embodiment, a maintenance component 150 may receive storage requests and/or refresh commands as an API call from a storage client 116, as an IO-CTL command, or the like.

In one embodiment, a maintenance component 150 is disposed on a device controller 126 or other interposer between a host device 110 and/or processor 111 and a memory element 123, and receives refresh commands for the memory element 123 on the device controller 126 or another interposer. In another embodiment, a maintenance component 150 is integrated on a memory element 123 (e.g., an on-die controller, a state machine, and/or other logic hardware or executable code) and receives refresh commands directly from a host device 110 and/or processor 111 without an interposer therebetween. In other embodiments, a portion of a maintenance component 150 may be disposed on a device controller 126 or other interposer and a portion of a maintenance component 150 may be disposed on a memory element 123.

According to various embodiments, a memory controller 126 may manage one or more memory devices 120 and/or memory elements 123. The memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a memory device 120). Memory units and/or regions may include, but are not limited to: pages, memory divisions, blocks, sectors, collections or sets of physical storage locations (e.g., logical pages, logical blocks), or the like.

A device driver and/or the memory media controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the memory device 120 may maintain metadata 135, such as a logical to physical address mapping structure, to map logical addresses of the logical address space 134 to media storage locations on the memory device(s) 120. A device driver may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

A device driver may be communicatively coupled to one or more memory devices 120. The one or more memory devices 120 may include different types of memory devices including, but not limited to: solid-state storage devices, semiconductor storage devices, SAN storage resources, volatile memory devices, non-volatile memory devices, or the like. The one or more memory devices 120 may comprise one or more respective memory media controllers 126 and memory media 122. A device driver may provide access to the one or more memory devices 120 via a traditional block I/O interface 131. Additionally, a device driver may provide access to enhanced functionality through the SCM interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the memory device 120. Also, in some embodiments, the SCM interface 132 presented to the storage clients 116 provides access to data transformations implemented by the one or more memory devices 120 and/or the one or more memory media controllers 126.

A device driver may present a logical address space 134 to the storage clients 116 through one or more interfaces. As discussed above, the logical address space 134 may comprise a plurality of logical addresses, each corresponding to respective media locations the on one or more memory devices 120. A device driver may maintain metadata 135 comprising any-to-any mappings between logical addresses and media locations, or the like.

A device driver may further comprise and/or be in communication with a memory device interface 139 configured to transfer data, commands, and/or queries to the one or more memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The memory device interface 139 may communicate with the one or more memory devices 120 using input-output control (IO-CTL) command(s), IO-CTL command extension(s), remote direct memory access, or the like.

The communication interface 113 may comprise one or more network interfaces configured to communicatively couple the computing device 110 and/or the memory controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The memory controller 126 is part of and/or in communication with one or more memory devices 120. Although FIG. 1 depicts a single memory device 120, the disclosure is not limited in this regard and could be adapted to incorporate any number of memory devices 120, a combination of one or more volatile memory devices 120 and one or more non-volatile memory devices 120, or the like.

In some embodiments, a non-volatile memory element 123 may comprise and/or be part of a non-volatile memory device 120 for storing data using an array of vertical, three-dimensional (3D) memory structures, in an array of two-dimensional (2D) memory structures, or the like. In certain embodiments, each vertical 3D memory structure may comprise multiple two terminal memory cells of storage class memory, such as phase change memory (PCM), magneto-resistive RAM (MRAM), resistive RAM (Re-RAM), or the like. For example, the system 100 may comprise one or more non-volatile memory elements 123, such as one or more chips, packages, dies, die planes, and/or other integrated circuit memory devices 120 (e.g., one or more monolithic, three-dimensional memory devices; semiconductor devices; and/or other solid-state devices) comprising a non-volatile memory medium 122.

In one embodiment, a non-volatile memory element 123 comprises a phase change memory device (e.g., a substrate with an array of columns and/or pillars comprising phase change material for storing data, or the like). A phase change material, as used herein, comprises a material with a physical property that is switchable into multiple states. For example, chalcogenide glass phase change materials may be quickly heated and quenched (e.g., cooled) into an amorphous state (e.g., a "reset" state) or held in a crystallization temperature range to switch into a crystalline state (e.g., a "set" state). In certain embodiments, an amorphous state of a phase change material may have a higher electrical resistance than a crystalline state of the phase change material.

In a further embodiment, a phase change material may have more than two distinct states, such as an amorphous state, a crystalline state, and/or one or more partially crystalline and/or partially amorphous states, each of which may have different levels of resistance. In one embodiment, two states of a phase change material may be used to store a single bit of data per cell (e.g., two states per cell, single level cell (SLC) memory, or the like). In a further embodiment, more than two states of a phase change material may be used to store multiple bits of data per cell (e.g., multiple states per cell, multilevel cell (MLC) memory, triple level cell (TLC) memory, quadruple level cell (QLC) memory, or the like).

An on-die controller for a memory element 123, in certain embodiments, may use different operations to place a memory cell into different states (e.g., to program the memory cell so store different data values) and/or to detect a state of a memory cell. An operation, as used herein, comprises an event or process associated with one or more memory cells. An operation, in various embodiments, may include a read or sense operation, a write or program operation, an erase operation, a PCM or ReRAM set or reset operation, a refresh operation, and/or another memory operation that changes and/or detects a state of a memory cell. For example, for PCM, ReRAM, and/or other storage class memory, the on-die controller for a memory element 123 may use a reset operation to place a memory cell into a reset amorphous state and/or may use a set operation to place a memory cell into a set crystalline state, or the like.

To perform a set operation, a reset operation, a read operation, or the like on a memory cell, the on-die controller for a memory element 123 may provide an electrical pulse to activate, turn on, and/or render conductive a selector (e.g., with a current and/or voltage satisfying a threshold of the selector, or the like). A selector, as used herein, comprises a non-linear element (NLE) or other switching element in electrical communication with a memory cell. Selectors may isolate different memory cells from each other, reducing program and/or read disturb effects that would otherwise occur during operations on neighboring memory cells. In response to the selector activating or turning on to conduct current, the on-die controller for a memory element 123 may provide one or more electrical pulses for the set operation, reset operation, read operation, or the like.

A reset operation may have a higher voltage and/or current than a set operation, but may have a shorter duration than a set operation, to increase temperature of the phase change material of the memory cell past the material's melting point and allowing it to quickly cool in a reset amorphous state without crystallizing, while a longer set operation with a lower voltage and/or current may provide the phase change material of the memory cell with a longer cooling time at a lower temperature such that the material crystallizes into a set crystalline state. A read operation may have a lower voltage and/or current than either a reset or a set operation, allowing the on-die controller for a memory element 123 to measure the state of a memory cell (e.g., the electrical resistance, whether the phase change material of the memory cell is crystalline or amorphous) without changing the state, with minimal disturbance to the state, or the like.

In certain embodiments, an on-die controller for a memory element 123 may use a single electrical pulse to both activate a selector and to perform an operation on the associated memory cell. For example, the on-die controller for a memory element 123 may monitor an electrical pulse (e.g., a voltage and/or current of the electrical pulse) on a word line and/or bit line for a memory cell to detect a spike and/or "pop" in the electrical pulse, indicating that the selector has been activated, turned on, is now conductive, or the like and may maintain a voltage and/or current of the electrical pulse at or above a threshold level for the operation in response to detecting the spike and/or pop.

Activating a selector for a memory cell and performing an operation on the memory cell both with a single electrical pulse, in some embodiments, may expedite the operation, taking less time than separate electrical pulses and/or allowing the memory element 123 to perform more input/output operations per second (TOPS), or the like. In one embodiment, activating a selector for a memory cell and performing an operation on the memory cell both with a single electrical pulse may be more power efficient than two separate pulses, as the operation may use some of the same electrical current from activating the selector (e.g., a predefined "soaking" period for an operation may begin when the selector pops, instead of beginning later when the on-die controller for a memory element 123 provides a second electrical pulse).

The non-volatile memory element 123 may comprise a substrate or other base or support structure. For example, the substrate may comprise a silicon wafer (e.g., mono-crystal silicon wafer, silicon on sapphire), a gallium arsenide wafer, ceramic, or the like. In certain embodiments, the substrate comprises one or more electrical connections (e.g., one or more pins, pads, leads, contacts, traces, electrically conductive holes, or the like) for the non-volatile memory element 123 to interface with a printed circuit board, packaging, and/or another electrical interface.

Several integrated circuit layers, in certain embodiments, may be deposited or otherwise formed on the substrate to form the non-volatile memory element 123. In some embodiments, the non-volatile memory element 123 includes a plurality of electrically conductive word lines and bit lines, with electrically insulating material between the electrically conductive word lines and bit lines (e.g., between adjacent word lines in the same layer, between word lines in different layers, between global bit lines, between local bit lines, between word lines and bit lines, and/or between other electrically conductive material of the non-volatile memory element 123). For example, the non-volatile memory element 123 may be formed with alternating layers of conductive material (e.g., metal) and insulating material (e.g., dielectric), or the like, using a masking process, a deposition process, and/or another similar process to form the word lines and bit lines.

The vertical memory structures comprise a non-volatile memory medium, such as a phase change material or the like, for storing data. In certain embodiments, the vertical memory structures may be formed using an iterative, layered deposition process with the layers of word lines and/or bit lines. In a further embodiment, one or more memory holes (e.g., openings) may be formed in the non-volatile memory element 123 during the fabrication and/or manufacturing process, in which the vertical memory structures may be deposited and/or otherwise formed. For example, memory holes or other openings may be preserved using a masking process (e.g., to prevent the deposition of electrically conductive material or electrically insulating material), memory holes or other openings may be drilled, cut, etched, and/or otherwise formed after the layers of electrically conductive material and electrically insulating material have been deposited, or the like.

The vertical memory structures, in certain embodiments, are deposited or otherwise formed in memory holes or other openings in the layers of electrically conductive material and electrically insulating material on the substrate. Non-volatile memory cells, in one embodiment, are formed at the intersection of the word lines, the bit lines, and the vertical memory structures, forming a three-dimensional array of non-volatile memory cells.

In one embodiment, a non-volatile memory medium of the vertical memory structures (e.g., a phase change material or the like) and/or one or more other layers (e.g., a separation layer, a selector layer, a central bit line layer, or the like) may be deposited in a memory hole or other opening using an atomic layer deposition (ALD) process and/or another thin film or chemical vapor deposition (CVD) process. For example, a sequence of precursor chemicals (e.g., alternate gaseous species, or the like) may be exposed to a surface of the memory hole or other opening, which acts as a substrate upon which the intended layer is grown (e.g., a layer of phase change material or other non-volatile memory medium, a separation layer of carbon and/or an oxide, a selector layer of a different phase change material, a metallic central bit line layer, or the like). In one embodiment, multiple precursors may be used simultaneously. In another embodiment, different precursors may be inserted in a series of sequential, non-overlapping pulses, or the like. In certain embodiments, the precursor molecules react with the surface in a self-limiting way, so that the reaction terminates once all the reactive sites on the surface are consumed (e.g., an ALD cycle). In other embodiments, a direct liquid injection (DLI) vaporizer deposition process may be used, a physical vapor deposition (PVD) process may be used, or the like.

The vertical memory structures, in one embodiment, comprise multiple layers, such as a conductive bit line layer (e.g., a local bit line, a central bit line, a vertical bit line, or the like), a non-volatile memory medium layer (e.g., a phase change memory material layer, or the like), a separation layer (e.g., a carbon layer, an oxide layer, or the like), a selector layer (e.g., a different phase change material layer, or the like), and/or another layer. In some embodiments, each vertical memory structure includes a central, vertical, electrically conductive bit line, with a phase change material disposed on at least two sides of the bit line (e.g., on two, opposite sides of the bit line; surrounding the bit line; or the like) as a non-volatile memory medium, a different phase change material disposed on at least two sides of the vertical memory structure (e.g., on two, opposite sides of the vertical memory structure; surrounding the vertical memory structure; or the like), and a carbon separation layer disposed between the phase change material and the different phase change material. One or more word lines, in one embodiment, are in electrical communication (e.g., in contact with) a selector layer (e.g., the different phase change material), forming one or more memory cells between each word line and associated bit line.

In one embodiment, a phase change material includes a chalcogenide glass material. For example, a phase change material suitable for a non-volatile memory medium may have a composition of $Ge_xSb_yTe_z$, or the like. In certain embodiments, x=2, y=2 and z=5 for a composition of $Ge_2Sb_2Te_5$, but other $Ge_xSb_yTe_z$ materials may be used. In other embodiments, a phase change material suitable for a non-volatile memory medium may comprise one or more of AsTeGeSi, AsTeGeSiN, GeSe, GeSb, AgInSbTe, GeTe, (e.g., $GeTe_6$ or the like), GaSb, BaSbTe, InSbTe and/or one or more other combinations of these elements (e.g., other combinations of one or more of As, Te, Ge, Si, N, Se, Sb, Ag, In, Ga, Ba, or the like).

A selector layer, in certain embodiments, may reduce and/or eliminate sneak path currents that may cause disturb effects and/or higher currents, allowing for a larger memory array size (e.g., more memory cells) than would be possible without selectors. In one embodiment, a selector comprises a non-linear element (NLE) and/or a switching element in electrical communication with a non-volatile memory medium (e.g., a phase change material or the like). A selector may provide selectivity for different memory cells of the non-volatile memory medium. Examples of selectors, in various embodiments, may include a diode, a transistor, a switch, a semiconductor, an inductor and/or transformer operated above its saturation current, or the like.

In one embodiment, a selector comprises an ovonic threshold switch (OTS) formed of a different phase change material than the non-volatile memory medium (e.g., a different chalcogenide glass material). An ovonic threshold switch may comprise a two-terminal symmetrical voltage sensitive switching device (e.g., current isolation device) comprising a chalcogenide and/or other phase change material, with at least a blocking state and a conducting state, or the like. In response to a voltage potential between a word line and a bit line exceeding a threshold voltage of an ovonic threshold switch for a non-volatile memory cell, the ovonic threshold switch becomes conductive, selecting the non-volatile memory cell and conducting electric current to the non-volatile memory cell.

An ovonic threshold switch selector, in various embodiments, may comprise a chalcogenide phase change material (e.g., an ovonic threshold switching material) such as AsTeGeSi, AsTeGeSiN, GeTe, GeSe, ZnTe, and/or one or more other combinations of these elements (e.g., other combinations of As, Te, Ge, Si, N, Se, Zn, or the like). A phase change material used for a selector (e.g., an ovonic threshold switching material), in one embodiment, has a higher melting point and/or phase change point than a melting point and/or phase change point of a phase change material used as a non-volatile memory medium. In this manner, in certain embodiments, the selector maintains its properties and does not change states or phases during normal operation (e.g., typical temperatures, voltages, and/or currents) of the non-volatile memory element 123, even when the non-volatile memory medium phase change material changes states or phases (e.g., OTS of the material is "locked" or otherwise remains in an amorphous state during operation, or the like). In other embodiments, instead of a phase change material such as an OTS material, selectors for the vertical memory structure may comprise a poly junction selector (e.g., a Si PN junction or the like), an oxide junction selector (e.g., an $O_x$ PN junction or the like), an oxide rectifier, a mixed-ionic-electronic-conduction (MIEC) based selector (e.g., $Cu^+$ in SE or the like), a metal-insulator-metal (MIM) junction, a metal-insulator-semiconductor (MIS) junction, a metal-semiconductor (MS) Schottky junction, or the like.

In one embodiment, the non-volatile memory medium (e.g., a phase change material) and the selector (e.g., a different phase change material such as an OTS material) are in series between a word line and a bit line, and are separated by a separation layer, which may comprise carbon, an oxide, or the like. Using two different types of phase change material, one as a non-volatile memory medium and one as a selector, in certain embodiments, may allow both to be formed using similar deposition processes (e.g., atomic layer deposition or the like), to operate in similar conditions (e.g., similar current density or the like), to be arranged in series (e.g., since both are two terminal devices), and/or to have other beneficial similarities.

However, in certain embodiments, due to the similarities between a phase change material of a non-volatile memory medium and a phase change material of a selector and/or due to the repeated melting and quenching of a phase change material or the like, the different phase change materials may intermix over time if placed in direct contact with each other. Each vertical memory structure, in one embodiment, includes one or more separation layers between different phase change materials (e.g., between a phase change material of a non-volatile memory medium and a phase change material, such as an OTS material, of a selector), to reduce and/or prevent intermixing of the different materials during high temperatures or the like.

In one embodiment, a separation layer comprises carbon. In another embodiment, a separation layer comprises an oxide. A carbon separation layer, in certain embodiments, may comprise a conductive form (e.g., graphene like-carbon), an insulating form (e.g., amorphous carbon), and/or another material comprising carbon. The difference conductive and insulating carbon materials is the content of the carbon chemical bonds (e.g., sp2 and/or sp3 hybridizations). In the sp3 configuration, the carbon valence electrons are kept in strong covalent bonds and as a result the sp3 hybridization is non-conductive. Carbon films in which the sp3 configuration dominates, may be referred to as tetrahedral-amorphous carbon, or diamond like. In the sp2 configuration, not all the carbon valence electrons are kept in covalent bonds. The weak tight electrons (e.g., phi bonds) contribute to the electrical conduction making the mostly sp2 configuration a conductive carbon material. In a further embodiment, where the separation layer comprises an oxide and/or a nitride material, the separation layer may comprise one or more of SiO, SiN, AlO, AlN, TaO, HfO, ZrO, TiO, NiO, WO, CoO, VO, NbO, CuO, ZnO, MoO, IrO, MgO, etc. (e.g., SiO may be stoichiometric $SiO_2$ or non-stoichiometric $SiO_x$ where x does not equal to 2, or the like).

In certain embodiments, a separation layer comprising carbon may perform better at higher temperatures than a separation layer comprising an oxide, a nitride, or the like. A resistance of a separation layer (e.g., comprising carbon, an oxide, a nitride, or the like), a resistance of a phase change material itself, a resistance of a word line (e.g., a metallic plug), or the like, in one embodiment, may heat the phase change material in response to receiving an electrical current from a selector (e.g., a different phase change material), in order to change the state or phase of the phase change material.

Thicknesses of layers in a vertical memory structure, in various embodiments, may range between about 1 nm and 500 nm. As described above, in response to a higher energy pulse applied for a shorter time, a region of the phase change material may melt and "quench" in an amorphous state, which is a lower conductive state. In response to a lower energy pulse applied for a longer time, such that the temperature remains above the crystallization temperature but below the melting temperature, the region of the phase change material may crystallize in a poly-crystal phase, which is a higher conductive state. In certain embodiments, instead of or in addition to relying on resistances of a separation layer and/or of the phase change material itself, one or more contacting electrodes may be used, comprising a high melting metal such as TiN, W, WN, TaN, or the like.

The memory device 120 may comprise one or more elements 123 of memory media 122. In one embodiment, an element 123 of memory media 122 comprises a volatile memory medium 122, such as random access memory (RAM), dynamic RAM (DRAM), synchronous DRAM (SDRAM), double data rate (DDR) SDRAM, static RAM (SRAM), thyristor RAM (T-RAM), zero-capacitor RAM (Z-RAM), or the like. In certain embodiments, an element 123 of memory media 122 comprises a non-volatile memory medium 122, such as ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more elements 123 of memory media 122, in certain embodiments, comprise storage class memory (SCM).

While legacy technologies such as NAND flash may be block and/or page addressable, storage class memory, in one embodiment, is byte addressable. In further embodiments, storage class memory may be faster and/or have a longer life (e.g., endurance) than NAND flash; or may have a lower cost, use less power, and/or have a higher bit storage density per chip than DRAM; or may offer one or more other benefits or improvements when compared to other technologies. For example, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 122 is referred to herein as "memory media," in various embodiments, the non-volatile memory media 122 may more generally comprise one or more non-volatile recording media capable of recording data, which may be referred to as a non-volatile memory medium, a non-volatile storage medium, or the like. Further, the non-volatile memory device 120, in various embodiments, may comprise a non-volatile recording device, a non-volatile memory device, a non-volatile storage device, or the like. Similarly, a non-volatile memory element 123, in various embodiments, may comprise a non-volatile recording element, a non-volatile memory element, a non-volatile storage element, or the like.

The non-volatile memory media 122 may comprise one or more non-volatile memory elements 123, which may include, but are not limited to: chips, packages, planes, die, or the like. A non-volatile memory media controller 126 may be configured to manage data operations on the non-volatile memory media 122, and may comprise one or more processors, programmable processors (e.g., FPGAs), ASICs, micro-controllers, or the like. In some embodiments, the non-volatile memory media controller 126 is configured to store data on and/or read data from the non-volatile memory media 122, to transfer data to/from the non-volatile memory device 120, and so on.

The non-volatile memory media controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The non-volatile memory controller 126 may comprise and/or be in communication with a device driver executing on the computing device 110. A device driver may provide storage services to the storage clients 116 via one or more interfaces 131, 132, and/or 133. In some embodiments, a device driver provides a block-device I/O interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library. A device driver may be further configured to provide a cache interface 133 for caching data using the non-volatile memory system 102. A device driver may further comprise a non-volatile memory device interface 139 that is configured to transfer data, commands, and/or queries to the non-volatile memory media controller 126 over a bus 125, as described above.

Figure 2:
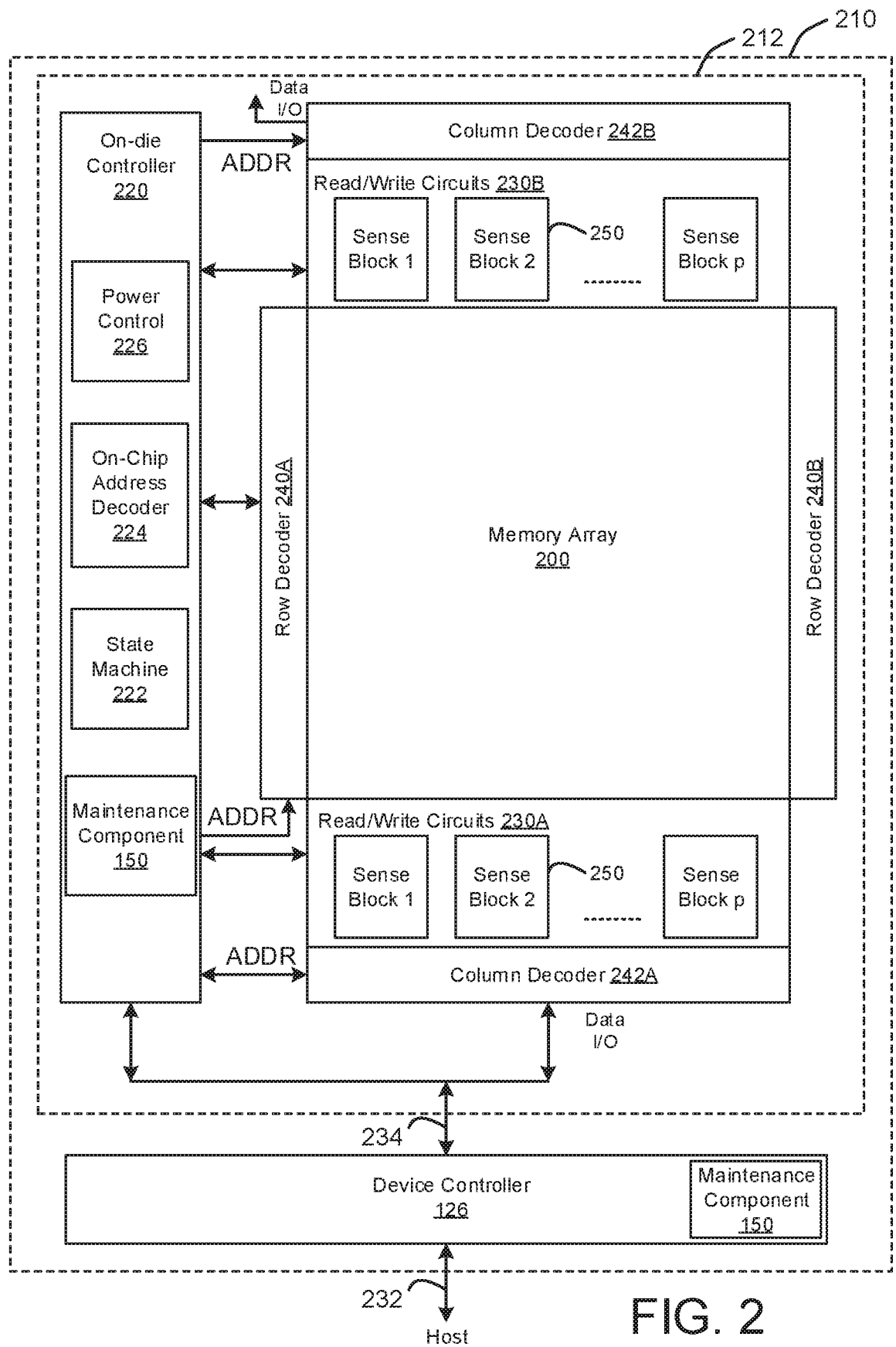
FIG. 2 is a schematic block diagram illustrating another embodiment of a system for data rewrite operations during a refresh window.

FIG. 2 illustrates an embodiment of a non-volatile storage device 210 that may include one or more memory die or chips 212. The nonvolatile storage device 210 may be substantially similar to the nonvolatile memory device 120 described with reference to FIG. 1. Memory die 212, in some embodiments, includes an array (two-dimensional or three dimensional) of memory cells 200, die controller 220, and read/write circuits 230A/230B. In one embodiment, access to the memory array 200 by the various peripheral circuits is implemented in a symmetric fashion, on opposite sides of the array, so that the densities of access lines and circuitry on each side are reduced by half. The read/write circuits 230A/230B, in a further embodiment, include multiple sense blocks 250 which allow a page of memory cells to be read or programmed in parallel.

The memory array 200, in various embodiments, is addressable by word lines via row decoders 240A/240B and by bit lines via column decoders 242A/242B. In some embodiments, a controller 126 is included in the same memory device 210 (e.g., a removable storage card or package) as the one or more memory die 212. Commands and data are transferred between the host and controller 126 via lines 232 and between the controller and the one or more memory die 212 via lines 234. One implementation can include multiple chips 212.

A die controller 220, in one embodiment, cooperates with the read/write circuits 230A/230B to perform memory operations on the memory array 200. The die controller 220 and/or the device controller 126, in certain embodiments, includes a maintenance component 150, a state machine 222, an on-chip address decoder 224, and a power control circuit 226. The maintenance component 150, in one embodiment, is configured to perform one or more data rewrite operations and/or other memory maintenance operations on the memory array 200 in response to a refresh command from a memory controller of the host 110 over the lines 232, from the device controller 126 over the lines 234, or the like.

The state machine 222, in one embodiment, provides chip-level control of memory operations. The on-chip address decoder 224 provides an address interface to convert between the address that is used by the host or a memory controller to the hardware address used by the decoders 240A, 240B, 242A, 242B. The power control circuit 226 controls the power and voltages supplied to the word lines and bit lines during memory operations. In one embodiment, power control circuit 226 includes one or more charge pumps that can create voltages larger than the supply voltage.

In certain embodiments, the state machine 222 includes at least a portion of the maintenance component 150. The maintenance component 150, in certain embodiments, may include software, firmware, and/or hardware of a die controller 220, a state machine 222, and/or a device controller 126.

In one embodiment, one or any combination of die controller 220, device controller 126, maintenance component 150, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 126 can be referred to as one or more managing circuits.

Figure 3:
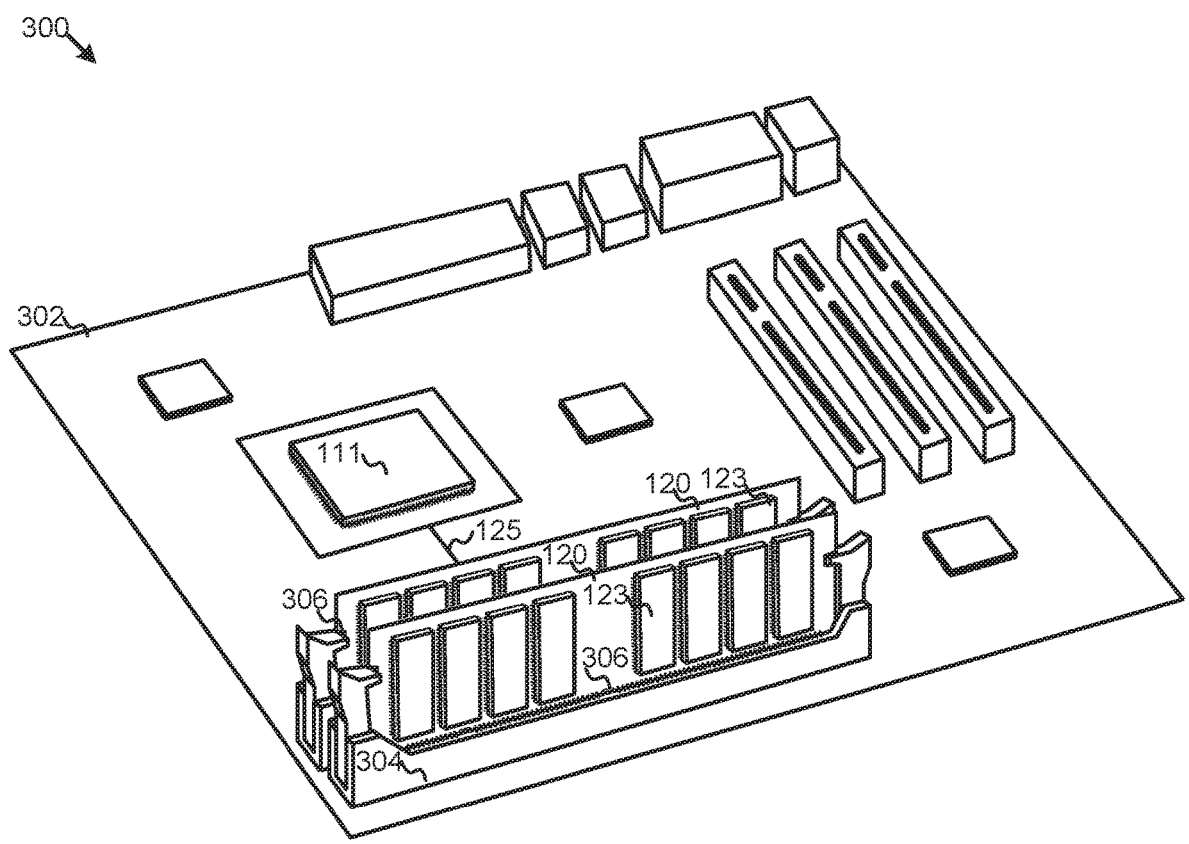
FIG. 3 is a schematic block diagram illustrating a further embodiment of a system for data rewrite operations during a refresh window.

FIG. 3 depicts one embodiment of a system 300 for data rewrite and/or other memory maintenance operations during a refresh window. The system 300, in the depicted embodiment, includes a motherboard 302 or other printed circuit board 302 with one or more memory sockets 304, a processor 111, a memory bus 125, and one or more non-volatile memory devices 120 of non-volatile memory elements 123.

In one embodiment, the motherboard 302 or other printed circuit board 302 comprises one or more insulators, one or more conductors, or the like to provide electrical connections and/or mechanical support for the processor 111, for the one or more non-volatile memory devices 120 (e.g., through the one or more memory sockets 304). The one or more memory sockets 304, in certain embodiments, may provide one or more electrical connections from the motherboard 302 and/or processor 111 to the one or more non-volatile memory devices 120, such as electrical connections to the memory bus 125, or the like. The one or more memory sockets 304 may provide mechanical support to the one or more non-volatile memory devices 120 (e.g., with one or more locking mechanisms, a memory slot, one or more keys, or the like). The one or more memory devices 120 may comprise one or more notches 306 and/or other mechanical interfaces 306 configured to mechanically interface with a memory socket 304, to provide alignment of a memory device 120 with regard to a memory socket 304, or the like.

In certain embodiments, the one or more memory sockets 304 may comprise volatile memory sockets 304 coupled to the motherboard 302 and to the host memory bus 125. A non-volatile memory device 120 may comprise volatile memory mechanical and electrical connections 306, complementary to the volatile memory mechanical and electrical connections of a volatile memory socket 304 configured to receive a volatile memory module, in order to interface with the volatile memory socket 304. In this manner, a non-volatile memory device 120 may receive periodic volatile memory refresh commands, read command, write commands, or the like from the host memory bus 125 through a volatile memory socket 304, having the benefits of a non-volatile memory medium 122 and compatibility with a volatile memory interface of the volatile memory socket 304.

In one embodiment, the processor 111 may comprise a central processing unit (CPU), one or more CPU cores, a microprocessor, an application-specific instruction set processor (ASIP), a graphics processing unit (GPU), or the like. The processor 111 may support an x86 instruction set, a reduced instruction set computing (RISC) instruction set, an advanced RISC machine (ARM) instruction set, or the like. As described in greater detail below with regard to FIG. 4A and FIG. 4B, in certain embodiments, a processor 111 may comprise and/or be in communication with a memory controller 402, which may manage and/or control the one or more non-volatile memory devices 120. The memory controller 402 may comprise a volatile memory controller 402 that periodically sends refresh commands over the memory bus 125 to one or more non-volatile memory devices 120 (e.g., through the one or more memory sockets 304).

In one embodiment, the memory bus 125 comprises one or more electrical conductors that transmit commands, data, addresses, and/or other signals to the one or more non-volatile memory devices 120 (e.g., through the one or more memory sockets 304). The memory bus 125 may be a volatile memory bus 125, designed and/or intended for a volatile memory device, but used by the one or more non-volatile memory devices 120 to provide synchronous non-volatile storage for the processor 111 over the volatile memory bus 125 (e.g., with reverse compatibility with the volatile memory bus 125, one or more volatile memory protocols such as a volatile memory refresh command, a volatile memory read command, a volatile memory write command, or the like). As described in greater detail below with regard to FIG. 7, in certain embodiments, the memory bus 125 may comprise a chip enable/chip select (CS) line, a row address strobe (RAS) line, a column address strobe (CAS) line, a write enable (WE) line, one or more address lines, one or more data lines, or the like.

The one or more non-volatile memory devices 120, in certain embodiments, comprise one or more dual in-line memory modules (DIMMs), with a series of memory elements 123 on a single printed circuit board (PCB), which may have separate electrical contacts on each side of the DIMM (e.g., 72 pins, 100 pins, 144 pins, 168 pins, 172 pins, 184 pins, 200 pins, 204 pins, 214 pins, 240 pins, 244 pins, 260 pins, 278 pins, 288 pins, more pins, or the like), may have memory elements 123 on one or both sides of the PCB (e.g., single-sided or double-sided), or the like. Each memory element 123 may provide a predefined number of bits (e.g., a data width), may be accessed in parallel, or the like. For example, if a non-volatile memory device 120 comprises nine memory elements 123 per side, with a four bit data width, the non-volatile memory device 120 may provide 36 bits per side or 72 bits total (e.g., if both sides are accessed in parallel). In a further example, with an eight bit data width, the non-volatile memory device 120 may provide 72 bits per side (e.g., 64 bits of user data and 8 bits of error correcting code (ECC) data, or the like). A non-volatile memory device 120 may operate at a single data rate (SDR) (e.g., with data clocked at a single clock edge per clock cycle), at a double data rate (DDR) (e.g., with data clocked on both clock edges per clock cycle), or the like.

In various embodiments, the motherboard 302 may be for a host computing device 110, such as a desktop computer, a laptop or other mobile computer, a server computer, a mobile device such as a smartphone or tablet, a television, a set top box, a network appliance, a video game system, a portable gaming device, a navigation device, an automobile or other vehicle, and/or another electronic device capable of sending data to and/or receiving data from a non-volatile memory device 120. For example, in embodiments where the motherboard 302 is for a mobile device, the one or more memory sockets 304 may be for mobile DDR (MDDR), low power DDR (LPDDR), or the like, and the one or more non-volatile memory devices 120 may be compatible with a low power DDR (e.g., LPDDR1) mobile volatile memory protocol. While the one or more memory sockets 304 are depicted as removably coupling the one or more non-volatile memory devices 120 to the motherboard 302, in other embodiments, the one or more memory sockets 304 may comprise electrical contacts (e.g., electrical pads, pins, or the like) on a surface of the motherboard 302, to which corresponding electrical contacts of a non-volatile memory device 120 may be coupled (e.g., with soldering, surface-mount packaging such as a ball grid array or pin grid array, through hole connections, or the like).

Figure 4A:
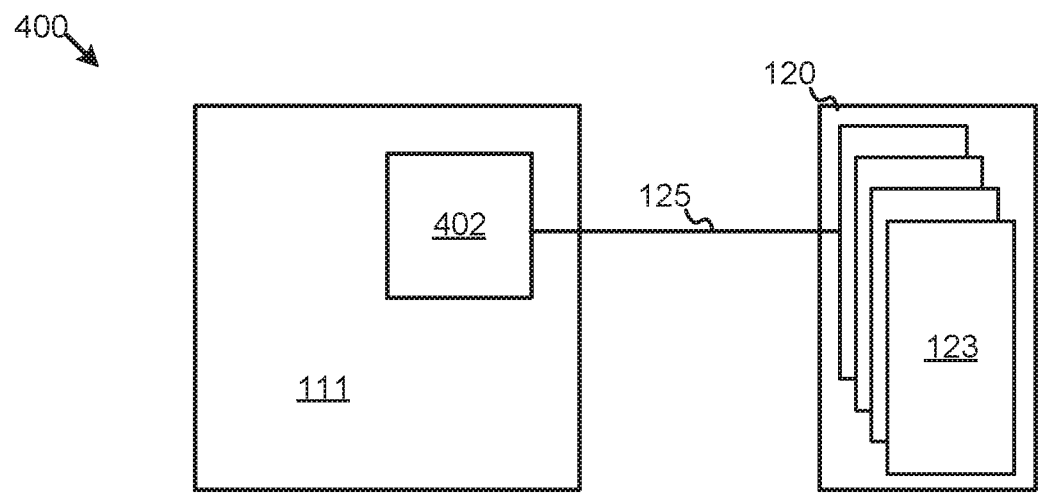
FIG. 4A is a schematic block diagram illustrating a certain embodiment of a system for data rewrite operations during a refresh window.

FIG. 4A depicts one embodiment of a system 400 for data rewrite and/or other memory maintenance operations during a refresh window. The system 400, in the depicted embodiment, includes a processor 111, a memory controller 402, a memory bus 125, a non-volatile memory device 120, and one or more non-volatile memory elements 123.

In the depicted embodiment, the processor 111 includes the memory controller 402 (e.g., as an integrated memory controller 402). The memory controller 402 may synchronously control the non-volatile memory device 120 (e.g., sending one or more synchronous read commands, one or more synchronous write commands, one or more synchronous refresh commands, or the like), which the non-volatile memory device 120 may execute substantially immediately (e.g., within a predefined window after receiving a command, with little or no delay, without executing a background operation, or the like). The memory controller 402 may comprise a volatile memory controller 402 configured to send periodic refresh commands to the non-volatile memory device 120 over the memory bus 125.

Figure 4B:
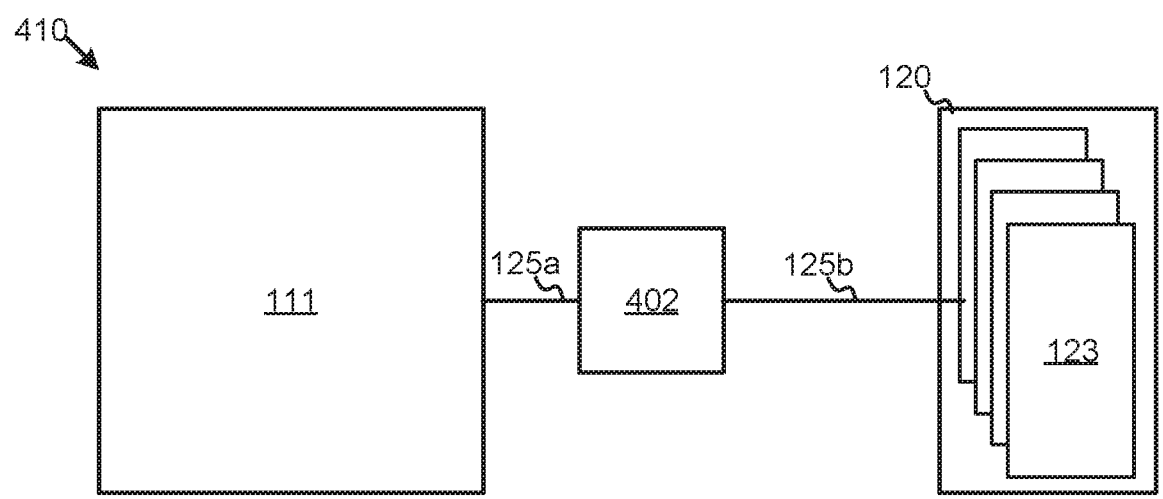
FIG. 4B is a schematic block diagram illustrating an embodiment of a system for data rewrite operations during a refresh window.

FIG. 4B depicts a further embodiment of a system 410 for data rewrite and/or other memory maintenance operations during a refresh window. The system 410, in the depicted embodiment, includes a processor 111, a memory controller 402, one or more memory buses 125a-b, a non-volatile memory device 120, and one or more non-volatile memory elements 123.

The system 410, in certain embodiments, may be substantially similar to the system 400, but with the memory controller 402 external to the processor 111. For example, the memory controller 402 may comprise a separate and/or independent chip or other integrated circuit device in communication with the processor 111 (e.g., as part of a chipset, as a Northbridge chip, or the like). The memory controller 402 may be in communication with the processor 111 over a first memory bus 125a, such as a front-side bus 125a, or the like, and may be in communication with the non-volatile memory bus 120 over a second memory bus 125b (e.g., a volatile memory bus 125b or the like). In other embodiments, the memory controller 402 may be co-located with the one or more non-volatile memory elements 123 on the non-volatile memory device 120 (e.g., as a device controller 126 or the like), may comprise an on-die controller 220 on each non-volatile memory element 123, and/or may have a different location relative to the one or more non-volatile memory elements 123.

Figure 5:
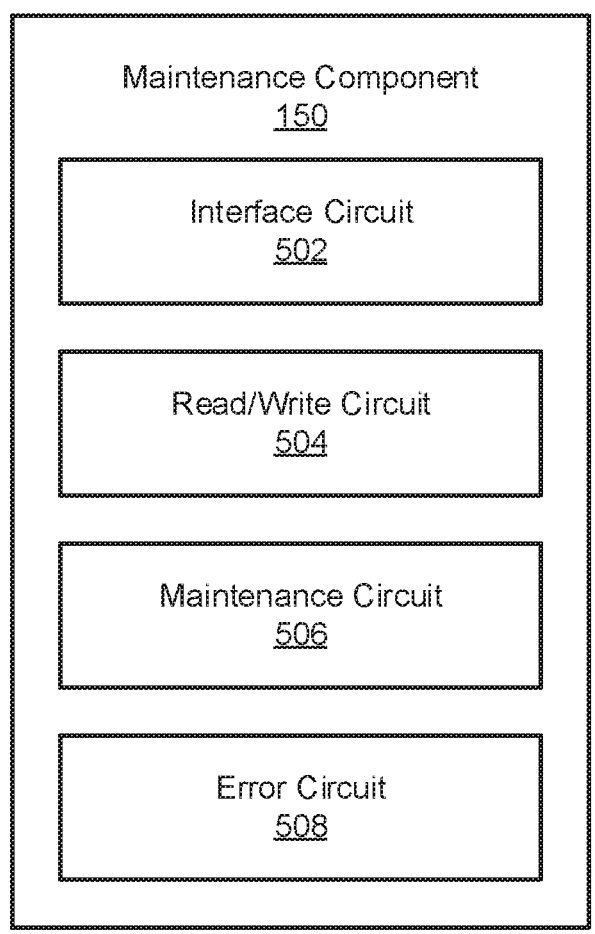
FIG. 5 is a schematic block diagram illustrating one embodiment of a maintenance component.

FIG. 5 depicts one embodiment of a maintenance component 150. In certain embodiments, the maintenance component 150 may be substantially similar to one or more of the maintenance circuits 150 described above with regard to FIG. 1 and/or FIG. 2. The maintenance component 150, in the depicted embodiment, includes an interface circuit 502, a read/write circuit 504, a maintenance circuit 506, and an error circuit 508.

In one embodiment, the interface circuit 502 is configured to receive commands, addresses, and/or data for a non-volatile memory device 120 (e.g., a non-volatile dual inline memory module (DIMM) or the like) over a memory bus 125, provide data from the non-volatile memory device 120 over the memory bus, or the like. For example, the interface circuit 502 may communicate with a memory controller 402 for a processor 111 over a memory bus 125.

Example commands 712a-i which the interface circuit 502 may receive from a memory controller 402 (e.g., over a CS line 702, a RAS line 704, a CAS line 706, a WE line 708, one or more address lines 710, or the like of a memory bus 125) are described below with regard to FIG. 7, such as a command inhibit command 712a, a no operation command 712b, a burst terminate command 712c, a read command 712d, a write command 712e, an activate row command 712f, a precharge/deactivate command 712g, a refresh command 712*h*, a load mode register command 712*i*, or the like. The interface circuit 502 may receive commands, addresses, and/or data from a memory bus 125 over pins or other electrical contacts of the non-volatile memory device 120 in electrical communication with the memory bus 125 through an electrical interface of the one or more memory sockets 304, or the like.

A refresh command, as used herein, comprises a signal, indicator, message, and/or other trigger. A refresh command may be sent from a memory controller 402 over a memory bus 125. A memory controller 402 may periodically send a refresh command with a predefined frequency (e.g., about every 5-10 microseconds, about every 6-9 microseconds, about every 7-8 microseconds, every 7.8 microseconds, or the like). In certain embodiments, a refresh command comprises a volatile memory refresh command (e.g., even if a non-volatile memory device 120 receives the volatile memory refresh command), such as a RAM refresh command, a DRAM refresh command, a SDRAM refresh command, a JEDEC refresh command, a JEDEC DDR3 SDRAM refresh command, a JEDEC DDR4 SDRAM refresh command, or the like.

In one embodiment, instead of being a volatile memory refresh command, a refresh command may comprise a synchronous maintenance command (e.g., a non-volatile data rewrite command and/or other memory maintenance command), defined to provide a maintenance window or other predefined time period for a non-volatile memory device 120 and/or non-volatile memory element 123 to perform one or more data rewrite operations and/or other memory maintenance operations, to enable synchronous operation of a non-volatile memory device 120 as described herein. A synchronous maintenance command may turn control of a non-volatile memory device 120 and/or a non-volatile memory element 123 to the device 120 and/or element 123 itself, or to an associated controller 126, 220 for one or more maintenance operations during a maintenance period, after which control may be returned to the memory controller 402 for synchronous read/write operation, or the like.

For volatile memory such as DRAM, each memory cell must be refreshed periodically (e.g., once every 64 msec, or the like). This may be done, for example, by issuing a refresh command every 8 usec where 1/8000 of the memory cells on the volatile memory element are refreshed during each refresh command. In another example, all 8000 refresh commands may be provided serially every 64 msec, or the like. In one embodiment, a refresh command may include an address (e.g., a row address or the like), and the memory controller 402 may manage and determine which memory cells are refreshed. In a further embodiment, a refresh command does not include an (e.g., an "auto" refresh), allowing a memory device 120 and/or a memory element 123 to internally determine which memory cells to refresh (e.g., a refresh address may be automatically determined on chip).

In certain embodiments, a refresh command comprises a combination of one or more signals on a memory bus 125. For example, a refresh command may comprise predefined states of and/or signals on one or more of a chip enable/chip select (CS) line, a row address strobe (RAS) line, a column address strobe (CAS) line, a write enable (WE) line (e.g., a low voltage state on a chip enable/chip select (CS) line, a low voltage state on a row address strobe (RAS) line, a low voltage state on a column address strobe (CAS) line, a high voltage state on a write enable (WE) line, and/or another predefined state or combination of states on lines of the memory bus 125).

In certain embodiments, a refresh command comprises an address (e.g., on one or more address lines of the memory bus 125), such as a row address (e.g., a volatile memory row address or the like). In one embodiment, the maintenance circuit 506 may perform a data rewrite operation and/or other memory maintenance operation for one or more non-volatile memory cells of a non-volatile memory medium 122, the one or more non-volatile memory cells associated with an address of a refresh command. In a further embodiment, the maintenance circuit 506 may disregard an address of a refresh command, managing and/or performing data rewrite operations and/or other memory maintenance operations independently of addresses provided by a memory controller 402 with a refresh command, performing a data rewrite operation and/or other memory maintenance operation for one or more non-volatile memory cells of a non-volatile memory medium 122 which are not associated with an address received with a refresh command. In other embodiments, a refresh command does not include an address (e.g., an "auto" refresh command, or the like).

A refresh period and/or window, as used herein, comprises a predefined time period. A refresh period, in certain embodiments, may be defined and/or measured relative to a refresh command, receipt of a refresh command, detection of a refresh command, or the like (e.g., a predefined time period after the interface circuit 502 receives and/or detects a refresh command, or the like). A duration of a refresh period, in certain embodiments, is selected to provide enough time to refresh data of a predefined portion of a volatile memory (e.g., reading data from an active row of volatile memory, latching the data, and rewriting the data back to the active row of volatile memory). A duration of a refresh period may be defined and/or measured in time, in clock cycles, or the like. In one embodiment, a refresh period comprises a maximum amount of time during which the maintenance circuit 506 may perform one or more data rewrite operations and/or other memory maintenance operations (e.g., and the maintenance circuit 506 may take less than a full refresh period to perform one or more maintenance operations, may selectively skip performing any maintenance operations during a commanded refresh period (e.g., on occasion determine to "no-op" and perform no operation), or the like).

A refresh period, in various embodiments, may comprise a time period between about 100-400 nanoseconds, between about 160 and 350 nanoseconds, less than about 160 nanoseconds, about 160 nanoseconds, about 350 nanoseconds, more than about 350 nanoseconds, and/or another predefined time period. In certain embodiments the read/write circuit 504 does not perform read and/or write operations for storage clients 116 during a refresh period, a maintenance circuit 506 may perform data rewrite operations and/or other memory maintenance operations exclusively during a refresh period, or the like, without the read/write circuit 504 performing other commanded operations of the same memory element 123 (e.g., without performing read or write operations requested by the host device 100, a storage client 116, the memory controller 402, or the like).

In certain embodiments, a predefined time period during which a maintenance circuit 506 performs one or more data rewrite operations and/or other memory maintenance operations may comprise up to a full refresh period or window (e.g., as defined for a volatile memory refresh, a volatile memory standard, or the like). In another embodiment, a predefined time period during which a maintenance circuit 506 performs one or more data rewrite operations and/or other memory maintenance operations (e.g., a maintenance period or window) may be defined as less than a full refresh period or window (e.g., to conserve power, to preserve a remaining battery life, because the one or more data rewrite operations and/or other memory maintenance operations take less time than a full refresh period or window, or the like). In some embodiments, a maintenance circuit 506 may increase a duration of a maintenance period over time (e.g., based on a program/erase count or other age indicator for a non-volatile memory device 120, for a non-volatile memory element 123, for a region of a non-volatile memory element 123, or the like), to provide more maintenance over time as the non-volatile memory device 120 ages. In one embodiment, the read/write circuit 504 may perform read and/or write operations after a maintenance period even if a refresh period has not completed, if the maintenance period is defined to be shorter than the refresh period.

In one embodiment, the read/write circuit 504 is configured to execute read and/or write operations on a non-volatile memory device 120 (e.g., a non-volatile dual inline memory module (DIMM) or the like) in response to the interface circuit 502 receiving read and/or write commands, or the like. Because, as described below, the maintenance circuit 506 may perform data rewrite operations and/or other memory maintenance operations during a predefined refresh time period after the interface circuit 502 receives a refresh command, in certain embodiments, the read/write circuit 504 may perform read and/or write operations synchronously (e.g., without the maintenance circuit 506 performing data rewrite operations and/or other memory maintenance operations in the background during execution of read and/or write operations by the read/write circuit 504, or the like).

In certain embodiments, a non-volatile memory device 120 may comprise write-in-place memory elements 123 (e.g., storage class memory (SCM) such as PCM, ReRAM, MRAM, or the like), with memory cells which may be programmed with data without the previously stored data first being erased, and the read/write circuit 504 may program write data in place without first erasing the associated memory cells. In other embodiments, the read/write circuit 504 may erase memory cells of a non-volatile memory device 120 prior to programming the memory cells (e.g., for NAND flash non-volatile memory elements 123, or the like).

In one embodiment, the maintenance circuit 506 is configured to perform one or more data rewrite operations and/or other memory maintenance operations on a non-volatile memory device 120 (e.g., a non-volatile dual inline memory module (DIMM) or the like) in response to the interface circuit 502 receiving a refresh command from a memory controller 402 over a memory bus 125. The maintenance circuit 506, in certain embodiments, may perform the one or more data rewrite operations and/or other memory maintenance operations synchronously, in the foreground, during a predefined time period after the interface circuit 502 receives a refresh command (e.g., rather than performing one or more data rewrite operations and/or other memory maintenance operations in the background, delaying read and/or write operations of the read/write circuit 504, or the like).

A maintenance operation, as used herein, may comprise a management and/or system operation for one or more memory elements 123 of a memory medium 122, such as a data rewrite operation or the like. For example, the maintenance circuit 506, in certain embodiments, performs a maintenance operation in response to a refresh command from a memory controller 402, rather than in response to a read and/or write request from a storage client 116, or the like. In one embodiment, the maintenance circuit 506 may cooperate with the read/write circuit 504, to read and/or write data internally within a non-volatile memory device 120 as part of a data rewrite operation and/or other memory maintenance operation (e.g., to read data from a location and to write the data back to the same or a different location; to read data from a location, rotate the data, and write it back to the same or different location; to read data from a location and write the data to a different location; to swap locations; or the like).

As described below with regard to the rewrite circuit 602 of FIG. 6, in certain embodiments, the maintenance circuit 506 performs a maintenance operation comprising a data rewrite operation. For example, the maintenance circuit 506 may perform a data rewrite operation by reading data from a location or region of a non-volatile memory element 123 and may rewrite at least a portion of the read data back to the same location or region of the non-volatile memory element 123, to a different location, or the like. In certain embodiments, the maintenance circuit 506 may rotate, shift, and/or otherwise adjust or reorganize read data being written back to a region of a non-volatile memory element 123 for a data rewrite operation (e.g., providing wear leveling within a region of a non-volatile memory element 123, such as an ECC codeword, a block, a page, a word line, a die, a die plane, a row, a column, a chip, and/or another region of memory).

As described below with regard to the wear leveling circuit 604 of FIG. 6, in certain embodiments, the maintenance circuit 506 performs a data rewrite operation comprising a memory wear leveling operation. For example, the maintenance circuit 506 may perform a memory wear leveling operation reading data from a location/region of a non-volatile memory element 123 and writing at least a portion of the read data to a different location/region of a non-volatile memory element 123 (e.g., providing wear leveling between different regions of one or more non-volatile memory elements 123, such as an ECC codeword, a block, a page, a word line, a die, a die plane, a chip, and/or another region of memory). For example, the maintenance circuit 506 may perform a memory wear leveling operation or other data rewrite operation such as a garbage collection or storage capacity recovery operation to move valid data to a different region of memory while recovering storage capacity of unused or invalid data, rewriting data to a different region of memory to prevent data loss, or the like during a predefined time period after the interface circuit 502 receives a refresh command (e.g., periodically in response to an error metric satisfying an error threshold, a predefined temperature condition, a predefined time condition, a predefined read disturb condition, a predefined write disturb condition, or the like being satisfied prior to the interface circuit 502 receiving the refresh command, or the like).

As described below with regard to the retirement circuit 606 of FIG. 6, in certain embodiments, the maintenance circuit 506 performs a maintenance operation comprising a replacement operation. For example, the maintenance circuit 506 may perform a replacement operation replacing and/or retiring a region of memory (e.g., failing and/or near failing memory cells, a region of memory satisfying an error threshold and/or another retirement threshold, or the like). The maintenance circuit 506 may logically remap spare or extra storage regions of a non-volatile memory element 123 to replace a different storage region of a non-volatile memory element 123, or the like. The maintenance circuit 506 may swap one or more used portions of a non-volatile memory element 123 with one or more less used portions of the non-volatile memory element 123 by moving one or several locations during one refresh period, and moving a next location during a next refresh period, or the like. To swap one location of memory for another, in certain embodiments, the maintenance circuit 506 may use multiple refresh periods (e.g., read location x during a first refresh period, read location y during a second refresh period, write data from location x in location y during a third refresh period, write data from location y in location x during a fourth refresh period, increment a refresh pointer during a fifth refresh period, repeat the process for another swap, or the like).

In certain embodiments, the maintenance circuit 506 may selectively skip performance of one or more data rewrite operation and/or other memory maintenance operations in response to one or more refresh commands. For example, the maintenance circuit 506 may refresh, wear level, and/or manage retirement for memory cells of the non-volatile memory medium 122 (e.g., one or more non-volatile memory elements 123) faster and/or in less time than is available during predefined refresh windows after refresh commands (e.g., since the refresh commands' period and/or a size of a refresh window may be selected based on one or more characteristics of volatile memory). To conserve power, during certain refresh periods of time after one or more refresh commands, the maintenance circuit 506 may selectively skip performance of a data rewrite operation and/or other memory maintenance operation. For example, the maintenance circuit 506 may skip refresh cycles used for wear leveling swaps more often if a higher percentage of operations are reads instead of writes (e.g., reducing an urgency of wear leveling, or the like).

In certain embodiments, the maintenance circuit 506 may split a data rewrite operation and/or other memory maintenance operation across multiple refresh periods of time. For example, the maintenance circuit 506 may read data from a location/region of memory during a first refresh time period after the interface circuit 502 receives a first refresh command, and may rewrite the read data during a second refresh time period after the interface circuit 502 receives a second refresh command (e.g., to a same location/region of memory for a rewrite maintenance operation, to a different location/region of memory for a wear-leveling maintenance operation and/or a replacement maintenance operation, or the like). Splitting performance of a data rewrite operation and/or other memory maintenance operation across multiple refresh periods, in various embodiments, may reduce power consumption, may facilitate completing a step of a data rewrite operation and/or other memory maintenance operation within an allowed refresh period, may allow a longer data rewrite operation and/or other memory maintenance operation to be performed in steps, or the like.

In one embodiment, the maintenance circuit 506 is configured to perform a data rewrite operation and/or another memory maintenance operation in response to the error circuit 508 determining that an error metric satisfies an error threshold. The error circuit 508, in certain embodiments, may be configured to determine an error metric for a non-volatile memory medium (e.g., a location/region of one or more memory cells from which data is read) in response to a read request for data from the non-volatile memory medium. For example, the error circuit 508 may determine an error rate, count errors, or the like as data is being read and/or corrected from a location/region of a non-volatile memory medium 122, or the like (e.g., based on a number of errors that are detected and/or corrected in an error correcting code (ECC) codeword of data by an ECC decoder or the like). The error circuit 508, in some embodiments, may cooperate with an ECC decoder (e.g., an on-die ECC decoder on a non-volatile memory element 123, or the like) to determine an error metric based on how many bit errors the ECC decoder detects, corrects, or the like. For example, if the ECC can correct errors in 7 bits, the error threshold to write back read data may be set at 5 bits, 6 bits, or the like.

An error metric, as used herein, comprises an indicator of a set of zero or more errors in data, in a location/region of a non-volatile memory medium 122, or the like. In one embodiment, an error metric comprises a number of errors in data read from a location/region of a non-volatile memory medium 122 (e.g., in an ECC codeword, a page, a word line, a block, or the like). In a further embodiment, an error metric comprises an error rate for data read from a location/region of a non-volatile memory medium, such as a raw bit error rate (RBER), an uncorrectable bit error rate (UBER), or the like. In other embodiments, an error metric may comprise another indicator of errors in data and/or in a location/region of a non-volatile memory medium 122.

In one embodiment, the error circuit 508 determines an error metric for data each time data is read. In a further embodiment, the error circuit 508 may periodically determine an error metric for data (e.g., each N times the data is read). In certain embodiments, a rate at which the error circuit 508 determines error metrics may increase over time as the non-volatile memory device 120 ages (e.g., based on a program/erase (PE) cycle count, a read count, a write count, or the like).

The maintenance circuit 506, in certain embodiments, is configured to perform one or more maintenance operations during a refresh window or other predefined time period after receiving a refresh command in response to an error metric satisfying an error threshold. For example, in some embodiments, the maintenance circuit 506 may rewrite data from a location/region of a non-volatile memory medium 122 back to the non-volatile memory medium 122 during a refresh window or other predefined time period after a refresh command, in response to an error metric satisfying an error threshold. As described above, in some embodiments a rewrite operation may write data back to the same location/region of the non-volatile memory medium 122 (e.g., in a same order, in a rotated order, or the like). In other embodiments, a rewrite operation may write data to a different location/region of the non-volatile memory medium 122. In this manner, in one embodiment, the maintenance circuit 506 only performs rewrite operations and/or other maintenance operations selectively during certain refresh windows, when errors satisfy an error threshold, allowing the non-volatile memory device 120 to operate synchronously (e.g., without performing rewrite operations and/or other maintenance operations in the background during other memory operations and/or outside of a refresh window).

An error threshold, as used herein, comprises a predefined level relative to an error metric. For example, an error threshold may be set less than or equal to a correctable number of bit errors for read data (e.g., for an ECC codeword of data, or the like), so that the maintenance circuit 506 may rewrite the read data before cumulative errors render the data uncorrectable. An error threshold, in various embodiments, may be set relative to a number of errors, an error rate, and/or relative to another type of error metric. In some embodiments, an error metric satisfies an error threshold in response to the error metric exceeding the error threshold. In other embodiments, an error metric may satisfy an error threshold in response to the error metric equaling the error threshold, in response to the error metric crossing the error threshold, in response to the error metric being less than the error threshold, and/or in response to the error metric having another predefined relationship relative to the error threshold.

In response to the error circuit 508 determining that an error metric for read data satisfies an error threshold, in some embodiments, the maintenance circuit 506 is configured to buffer the read data between reading the data in response to the read request and rewriting the data in response to the refresh command. For example, in response to the error circuit 508 determining that the error metric for read data satisfies the error threshold, the maintenance circuit 506 may buffer and/or store the read data in volatile memory, such as a read buffer, a transfer buffer, or the like of the non-volatile memory device 120 until the next refresh command is received and the maintenance circuit 506 rewrites the data back to the non-volatile memory medium 122.

Figure 6:
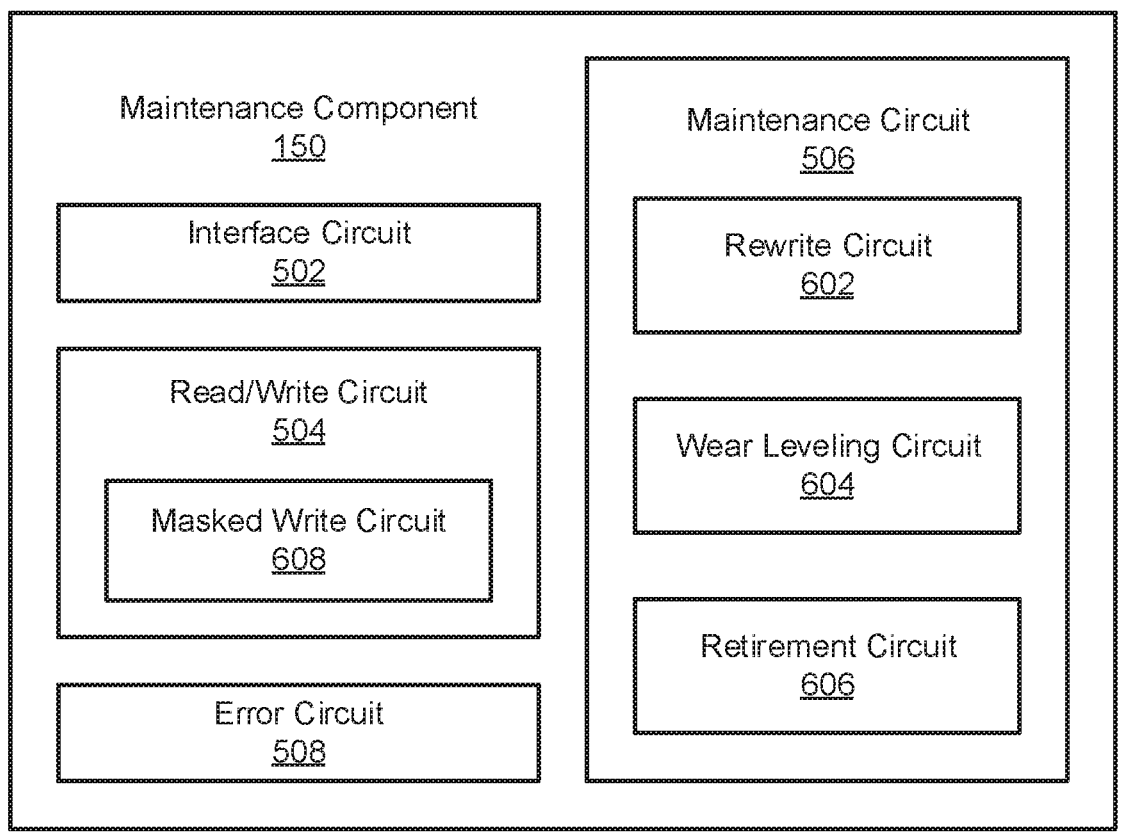
FIG. 6 is a schematic block diagram illustrating a further embodiment of a maintenance component.

FIG. 6 depicts a further embodiment of a maintenance component 150. In certain embodiments, the maintenance component 150 may be substantially similar to one or more of the maintenance circuits 150 described above with regard to FIG. 1, FIG. 2, and/or FIG. 5. The maintenance component 150, in the depicted embodiment, includes an interface circuit 502, a read/write circuit 504 which includes a masked write circuit 608, an error circuit 508, and a maintenance circuit 506 which includes a rewrite circuit 602, a wear leveling circuit 604, and a retirement circuit 606. In certain embodiments, one or more of the interface circuit 502, the read/write circuit 504, and/or the maintenance circuit 506 may be substantially similar to the interface circuit 502, the read/write circuit 504, and/or the maintenance circuit 506 described above with regard to FIG. 5.

In one embodiment, the rewrite circuit 602 is configured to perform a maintenance operation comprising a data rewrite operation. For example, the rewrite circuit 602 may cooperate with the read/write circuit 504 to perform a data rewrite operation comprising reading data from a location/region of a non-volatile memory element 123 and rewriting at least a portion of the read data back to the same location/region of the non-volatile memory element 123, to a different location/region of the non-volatile memory element 123, to a location/region of a different non-volatile memory element 123, or the like. In certain embodiments, the rewrite circuit 602 may rotate, shift, and/or otherwise adjust or reorganize read data the rewrite circuit 602 writes back to a region of a non-volatile memory element 123 for a data rewrite operation (e.g., providing wear leveling within a region of a non-volatile memory element 123, such as an ECC codeword, a block, a page, a word line, an ECC code word, a row, a column, a die, a die plane, a chip, and/or another region of memory).

For example, the rewrite circuit 602 may use a rolling shift (e.g., shifting each bit of data to a next address of a location/region, rolling a last bit around to a first bit, or the like) for each data rewrite operation for a location/region of a non-volatile memory element 123, may use a random shift for each data rewrite operation of a location/region of a non-volatile memory element 123 (e.g., using a mapping table or the like to track the randomization), and/or may otherwise rotate and/or shift data during a data rewrite operation. A location/region of a non-volatile memory element 123, in certain embodiments, may comprise one or more extra memory cells (e.g., an extra block, an extra bit line, an extra word line, or the like) which the rewrite circuit 602 may use to rotate and/or shift data into during a data rewrite operation.

In one embodiment, the wear leveling circuit 604 is configured to perform a data rewrite operation comprising a memory wear leveling operation. For example, the wear leveling circuit 604 may perform a memory wear leveling operation reading data from a location/region of a non-volatile memory element 123 and writing at least a portion of the read data to a different location/region of a non-volatile memory element 123 (e.g., providing wear leveling between different locations/regions of one or more non-volatile memory elements 123, such as an ECC codeword, a block, a page, a word line, a die, a die plane, a chip, and/or another region of memory). For example, the wear leveling circuit 604 may perform a memory wear leveling operation such as a garbage collection or storage capacity recovery operation to move valid data to a different location/region of memory while recovering storage capacity of invalid data, rewriting data to a different location/region of memory to prevent data loss, or the like during a predefined time period after the interface circuit 502 receives a refresh command (e.g., periodically in response to an error metric satisfying an error threshold, a predefined temperature condition, a predefined time condition, a predefined read disturb condition, a predefined write disturb condition, or the like being satisfied prior to the interface circuit 502 receiving the refresh command, or the like).

In certain embodiments, when used in combination, the rewrite circuit 602 may provide wear leveling within a location/region of a non-volatile memory medium 122 and the wear leveling circuit 604 may provide wear leveling between different locations/regions of the non-volatile memory medium 122. The wear leveling circuit 604, in one embodiment, may copy and/or move data from a location/region of the non-volatile memory medium 122 that has been written less frequently than the rewrite circuit 602 rotates or otherwise moves data within the location/region of the non-volatile memory medium 122, or the like.

In one embodiment, the retirement circuit 606 is configured to perform a maintenance operation comprising a replacement operation. For example, the retirement circuit 606 may perform a replacement operation replacing and/or retiring a location/region of non-volatile memory of the non-volatile memory medium 122 (e.g., failing and/or near failing memory cells, a location/region of memory satisfying an error threshold and/or another retirement threshold, or the like). The retirement circuit 606 may logically remap into spare or extra storage locations/regions of a non-volatile memory element 123 to replace a different storage location/region of a non-volatile memory element 123, or the like. The non-volatile memory device 120, in certain embodiments, may include one or more extra and/or spare locations/regions of a non-volatile memory medium 122 (e.g., one or more spare blocks, pages, word lines, bit lines, rows, columns, ECC codewords, die, die planes, chips, or the like) which the retirement circuit 606 may use to substitute and/or replace a location/region of the non-volatile memory medium 122 satisfying a replacement threshold, or the like.

In one embodiment, the masked write circuit 608 is configured to program only data values that are different than currently stored data values for write operations executed by the read/write circuit 504 but to program each data value (e.g., even if a stored value is being overwritten with the same value) for write operations executed by the maintenance circuit 506 (e.g., one or more of the rewrite circuit 602, the wear leveling circuit 604, and/or the retirement circuit 606).

For example, the masked write circuit 608 may conserve power, reduce wear on the non-volatile memory medium 122, or the like by skipping programming of data when the data being written is the same as data already stored (e.g., on a bit by bit basis). For example, the masked write circuit 608 may read data from a location/region of the non-volatile memory medium 122 (e.g., a byte, a page, a word line, an ECC codeword, a block, or the like), compare the read data to the write data being written (e.g., using one or more logic operations such as a logical AND to determine which bits are the same, a logical exclusive OR (XOR) to indicate which bits are different, or the like) to create a bit mask, and may write and/or program data only when the bit mask indicates that the data being written is different than the data already stored. The masked write circuit 608 may disable masked writing (e.g., skipping of writing/programming a bit value over a similar bit value) for data rewrite operations and/or other memory maintenance operations, to ensure that each bit of data is refreshed as it is being moved, copied, refreshed, wear leveled, shifted, rotated, or the like as part of a data rewrite operation and/or other memory maintenance operation is properly written/programmed (e.g., to minimize data errors, to refresh each memory cell associated with the maintenance operation, or the like).

FIG. 7 is a table 700 including various embodiments of memory commands 712*a-i*. In the depicted embodiment, the commands 712*a-i* are indicated to a memory device 120 by a controller 402 over a memory bus 125, using one or more of a chip enable/chip select (CS) line 702, a row address strobe (RAS) line 704, a column address strobe (CAS) line 706, a write enable (WE) line 708, and/or one or more address lines 710.

As described above, in certain embodiments, a refresh command 712*h* may comprise a low voltage state on the chip enable/chip select (CS) line 702, a low voltage state on the row address strobe (RAS) line 704, a low voltage state on the column address strobe (CAS) line 706, a high voltage state on the write enable (WE) line 708, and/or another predefined state or combination of states on lines of the memory bus 125.

The graph 700 also depicts embodiments of other commands 712. For example, a high voltage state on the chip enable/chip select (CS) line 702 may comprise a command inhibit command 712*a*, inhibiting commands for a memory element 123 so the non-volatile memory element 123 ignores all other input pins while the CS line 702 is high (e.g., regardless of a state of other lines 704, 706, 708, 710). A low voltage state on the chip enable/chip select (CS) line 702, a high voltage state on the row address strobe (RAS) line 704, a high voltage state on the column address strobe (CAS) line 706, and a high voltage state on the write enable (WE) line 708 may comprise a no operation (NO OP) command 712*b*, in response to which no operation is performed (e.g., as a waiting period or the like).

A low voltage state on the chip enable/chip select (CS) line 702, a high voltage state on the row address strobe (RAS) line 704, a high voltage state on the column address strobe (CAS) line 706, and a low voltage state on the write enable (WE) line 708 may comprise a burst terminate command 712*c*, in response to which the read/write circuit 504 stops a burst read and/or burst write that is in progress. A low voltage state on the chip enable/chip select (CS) line 702, a high voltage state on the row address strobe (RAS) line 704, a low voltage state on the column address strobe (CAS) line 706, a high voltage state on the write enable (WE) line 708, and a column address on the one or more address lines 710, may comprise a read command 712*d*, in response to which the read/write circuit 504 reads data indicated by the column address from a currently active row. A low voltage state on the chip enable/chip select (CS) line 702, a high voltage state on the row address strobe (RAS) line 704, a low voltage state on the column address strobe (CAS) line 706, a low voltage state on the write enable (WE) line 708, and a column address on the one or more address lines 710, may comprise a write command 712*e*, in response to which the read/write circuit 504 writes data to a location indicated by the column address and the currently active row.

A low voltage state on the chip enable/chip select (CS) line 702, a low voltage state on the row address strobe (RAS) line 704, a high voltage state on the column address strobe (CAS) line 706, a high voltage state on the write enable (WE) line 708, and a row address on the one or more address lines 710, may comprise an activate command 712*f*, in response to which the read/write circuit 504 activates the indicated row for reading and/or writing. A low voltage state on the chip enable/chip select (CS) line 702, a low voltage state on the row address strobe (RAS) line 704, a high voltage state on the column address strobe (CAS) line 706, and a low voltage state on the write enable (WE) line 708, may comprise a precharge/deactivate command 712*g*, in response to which the read/write circuit 504 may precharge and/or deactivate the currently active row.

A low voltage state on the chip enable/chip select (CS) line 702, a low voltage state on the row address strobe (RAS) line 704, a low voltage state on the column address strobe (CAS) line 706, a low voltage state on the write enable (WE) line 708, and a mode indicator on the one or more address lines 710, may comprise a load mode register command 712*i*, in response to which the read/write circuit 504 may load the mode indicator into a mode register for the non-volatile memory element 123. The commands 712*a-i* and associated signal states 702, 704, 706, 708, 710 are provided as non-limiting examples, and other commands and/or signal states may be used in other embodiments.

Figure 8:
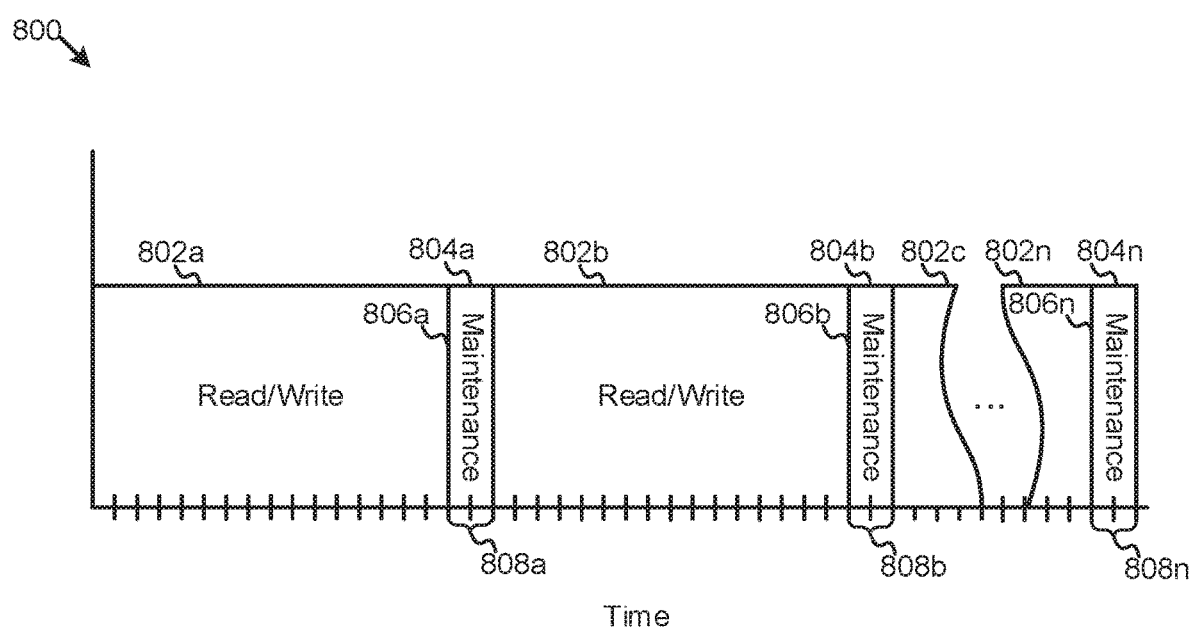
FIG. 8 is a schematic block diagram illustrating one embodiment of a graph for data rewrite operations during a refresh window performed over time.

FIG. 8 depicts one embodiment of a graph 800 of data rewrite and/or other memory maintenance operations 804*a-n* during refresh windows 808*a-n* over time. In the depicted embodiment, the read/write circuit 504 synchronously performs one or more read and/or write operations 802*a-n* on a non-volatile memory element 123. In response to the interface circuit 502 receiving a periodic refresh command 806*a-n*, the maintenance circuit 506 may "no-op" (e.g., perform no data rewrite operation and/or other memory maintenance operation) or synchronously perform one or more data rewrite operations and/or other memory maintenance operations 804*a-n* on the non-volatile memory element 123 during periodic refresh periods of time 808*a-n* occurring after each refresh period 806*a-n* is received.

In certain embodiments, the read/write circuit 504 does not perform read and/or write operations 802*a-n* during the periodic refresh periods of time 808*a-n*, and the maintenance circuit 506 either "no-ops" or performs data rewrite operations and/or other memory maintenance operations 804*a-n* exclusively during the periodic refresh periods of time 808*a-n*. In one embodiment, the maintenance circuit 506 may selectively "no-op" or skip performance of one or more data rewrite operations and/or other memory maintenance operations 804*a-n* (e.g., if a maintenance threshold is satisfied, if an error threshold is satisfied by an error metric, to conserve power, or the like) in response to the interface module 502 receiving a refresh command 806a-n.

Figure 9:
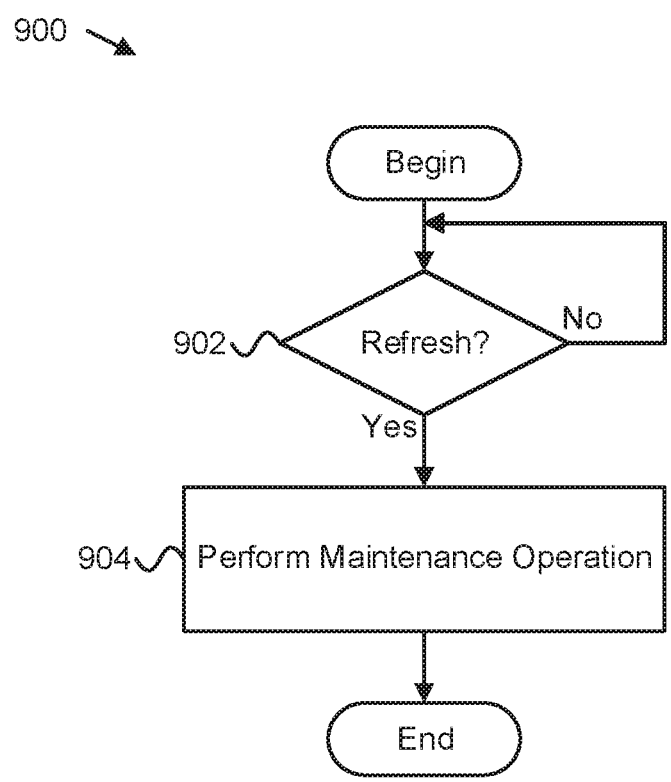
FIG. 9 is a schematic flow chart diagram illustrating one embodiment of a method for data rewrite operations during a refresh window.

FIG. 9 depicts one embodiment of a method 900 for data rewrite and/or other memory maintenance operations 804a-n during a refresh window 808a-n. For example, the method 900 may be performed if one or more characteristics and/or conditions of a non-volatile memory device 120 and/or a non-volatile memory element 123 warrant not skipping the data rewrite and/or other memory maintenance operations 804a-n (e.g. an error metric satisfies an error threshold, a number of writes to a non-volatile memory device 120 and/or to a non-volatile memory element 123 satisfy a maintenance threshold, or the like).

The method 900 begins and a non-volatile memory device 120 receives 902 a refresh command 808a-n from a controller 402 over a bus 125. The non-volatile memory device 120 performs 904 one or more data rewrite operations and/or other memory maintenance operations 804a-n on a non-volatile memory medium 122 of the non-volatile memory device 120 during a predefined time period 808a-n after receiving the refresh command 808a-n and the method 900 ends.

Figure 10:
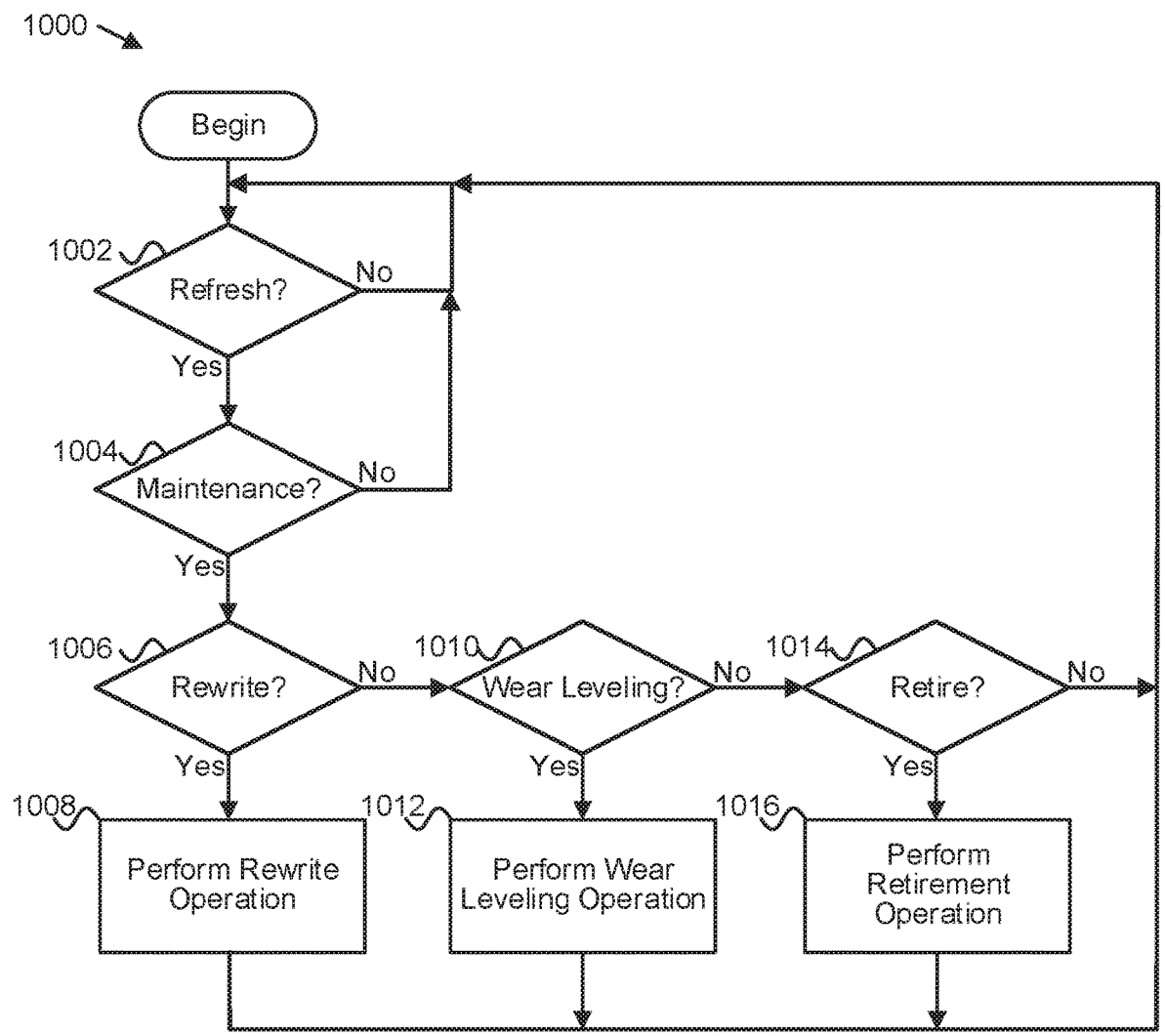
FIG. 10 is a schematic flow chart diagram illustrating a further embodiment of a method for data rewrite operations during a refresh window.

FIG. 10 depicts a further embodiment of a method 1000 for data rewrite and/or other memory maintenance operations 804a-n during a refresh window 808a-n. The method 1000 begins, and an interface circuit 502 periodically receives 1002 a refresh command 808a-n from a controller 402 over a memory bus 125. A maintenance circuit 506 determines 1004 whether or not to perform a data rewrite operation and/or other memory maintenance operation 804a-n on a non-volatile memory element 123 of non-volatile memory media 122. If the maintenance circuit 506 selectively determines 1004 not to perform a data rewrite operation and/or other memory maintenance operation 804a-n, the method 1000 continues until the interface circuit 502 receives 1002 a subsequent refresh command 808a-n from the controller 402 over the memory bus 125.

If the maintenance circuit 506 determines 1004 to perform a data rewrite operation and/or other memory maintenance operation 804a-n, the maintenance circuit 506 determines 1006, 1010, 1014 whether or not to perform a data rewrite operation, a wear leveling operation, and/or a retirement operation. If the maintenance circuit 506 determines 1006 to perform a data rewrite operation, the rewrite circuit 602 performs 1008 a data rewrite operation on one or more locations/regions of a non-volatile memory medium 122. If the maintenance circuit 506 determines 1010 to perform a wear leveling operation, the wear leveling circuit 604 performs 1012 a wear leveling operation on one or more locations/regions of a non-volatile memory medium 122. If the maintenance circuit 506 determines 1014 to perform a retirement operation, the retirement circuit 606 performs 1016 a retirement operation on one or more locations/regions of a non-volatile memory medium 122. The method 1000 continues until the interface circuit 502 receives 1002 a subsequent refresh command 808a-n from the controller 402 over the memory bus 125.

Figure 11:
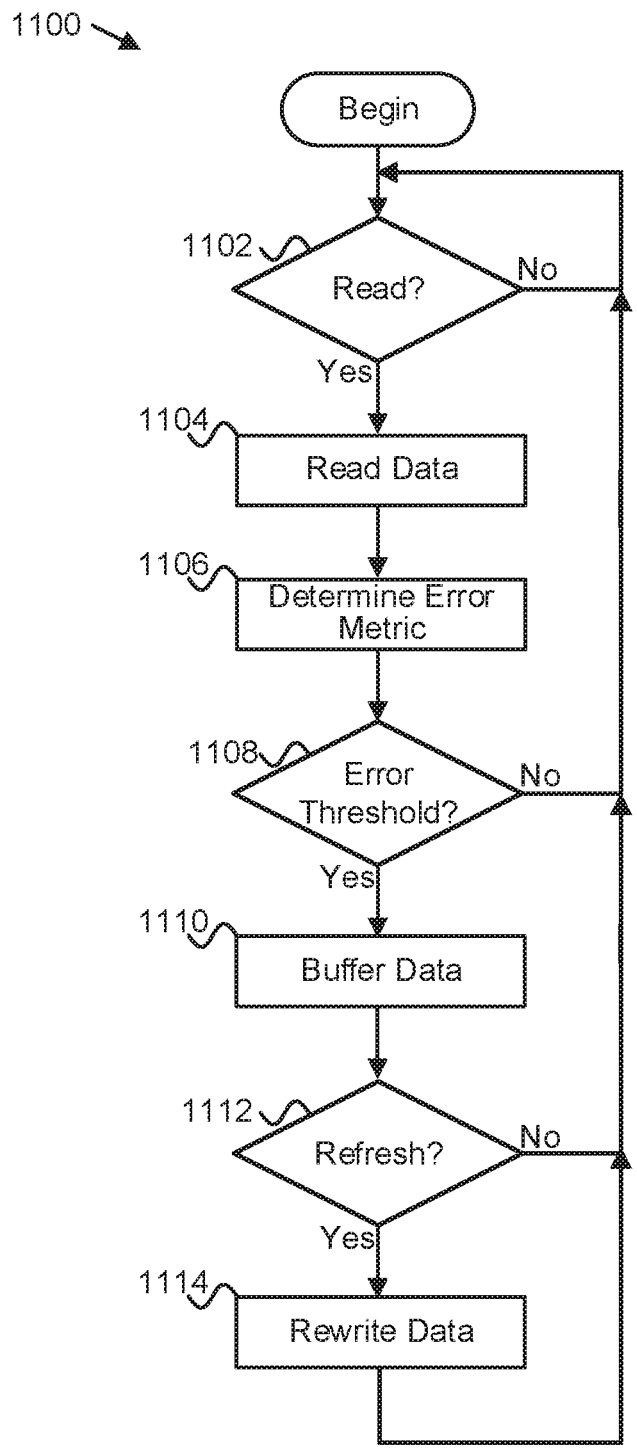
FIG. 11 is a schematic flow chart diagram illustrating a certain embodiment of a method for data rewrite operations during a refresh window.

FIG. 11 depicts one embodiment of a method 1100 for data rewrite and/or other memory maintenance operations 804a-n during a refresh window 808a-n. The method 1100 begins, and the interface circuit 502 determines 1102 whether a read request has been received. In response to the interface circuit 502 receiving 1102 a read request for data, the read/write circuit 504 reads 1104 the requested 1102 data from the non-volatile memory medium 122.

In cooperation with an ECC decoder correcting errors in the data (e.g., an ECC codeword of data, or the like), the error circuit 508 determines 1106 an error metric for the corrected read 1104 data. The error circuit 508 determines 1108 whether the determined 1106 error metric satisfies an error threshold. If the error circuit 508 determines 1108 that the error metric fails to satisfy the error threshold, the method 1100 continues for subsequent read request without rewriting the data.

If the error circuit 508 determines 1108 that the error metric satisfies the error threshold, the maintenance circuit 506 buffers 1110 the corrected, read 1104 data until the next refresh command. The interface circuit 502 determines 1112 when a periodic refresh command is received. In response to the interface circuit 502 receiving 1112 a refresh command, the maintenance circuit 506 rewrites 1114 the buffered 1110 data back to the non-volatile memory medium 122 and the method 1100 continues for subsequent read requests and subsequent refresh commands.

A means for periodically receiving refresh commands and/or triggers at a non-volatile memory element 123 over a bus 125, in various embodiments, may include an electrical pin, pad, or other contact; a maintenance component 150; an interface circuit 502; a maintenance circuit 506; a non-volatile memory element 123, a non-volatile memory device 120, a device controller 126; an on-die controller 220; a state machine 222; an integrated circuit device; an FPGA; an ASIC; other logic hardware; and/or other executable code stored on a computer readable storage medium. Other embodiments may include similar and/or equivalent means for periodically receiving refresh commands and/or triggers at a non-volatile memory element 123 over a bus 125.

A means for determining an error metric for an ECC codeword and/or other memory location/region in response to a read request, in various embodiments, may include a maintenance component 150, an error circuit 508, an ECC decoder, a non-volatile memory element 123, a non-volatile memory device 120, a device controller 126, an on-die controller 220, a state machine 222, an integrated circuit device, an FPGA, an ASIC, other logic hardware, and/or other executable code stored on a computer readable storage medium. Other embodiments may include similar and/or equivalent means for determining an error metric for an ECC codeword and/or other memory location/region in response to a read request.

A means for selectively rewriting an ECC codeword and/or other memory location/region of data to a non-volatile memory element 123 exclusively during a predefined time period after receiving one or more of refresh commands and/or triggers, in various embodiments, may include a maintenance component 150, a maintenance circuit 506, a wear leveling circuit 604, a rewrite circuit 602, a retirement circuit 606, a read/write circuit 504, a non-volatile memory element 123, a non-volatile memory device 120, a device controller 126, an on-die controller 220, a state machine 222, an integrated circuit device, an FPGA, an ASIC, other logic hardware, and/or other executable code stored on a computer readable storage medium. Other embodiments may include similar and/or equivalent means for selectively rewriting an ECC codeword and/or other memory location/region of data to a non-volatile memory element 123 exclusively during a predefined time period after receiving one or more of refresh commands and/or triggers.

A means for synchronously satisfying read requests between a predefined time period after receiving one or more refresh triggers and subsequent refresh triggers, in various embodiments, may include a maintenance component 150, a read/write circuit 504, a non-volatile memory element 123, a non-volatile memory device 120, a device controller 126, an on-die controller 220, a state machine 222, an integrated circuit device, an FPGA, an ASIC, other logic hardware, and/or other executable code stored on a computer readable storage medium. Other embodiments may include similar and/or equivalent means for synchronously satisfying read requests between a predefined time period after receiving one or more refresh triggers and subsequent refresh triggers.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
a non-volatile memory device comprising a non-volatile memory medium, the non-volatile memory device configured to:
  determine an error metric for the non-volatile memory medium in response to a read request for the non-volatile memory medium;
  receive a refresh command from a controller over a bus; and
  rewrite data from the non-volatile memory medium during a predefined time period after receiving the refresh command in response to the error metric satisfying an error threshold,
wherein the refresh command comprises a volatile memory refresh command, the predefined time period comprises a volatile memory refresh window for the volatile memory refresh command, and rewriting the data comprises a non-volatile memory maintenance operation.

2. The apparatus of claim 1, wherein the non-volatile memory device is further configured to buffer the data between reading the data in response to the read request and rewriting the data in response to the refresh command.

3. The apparatus of claim 1, wherein the data comprises an error correcting code ("ECC") codeword of data, the error metric comprises a number of bit errors in the ECC codeword, and the error threshold is less than or equal to a correctable number of bit errors for the ECC codeword.

4. The apparatus of claim 1, wherein the non-volatile memory device is configured to rewrite the data to its original location in the non-volatile memory medium thereby refreshing the data in the same location.

5. The apparatus of claim 4, wherein the non-volatile memory device is configured to rotate the data within the same location when rewriting the data during the predefined time period.

6. The apparatus of claim 1, wherein the non-volatile memory device is configured to rewrite the data to a different location in the non-volatile memory medium.

7. The apparatus of claim 1, wherein the non-volatile memory device is configured to rewrite data from the non-volatile memory medium during the predefined time period after receiving the refresh command and not to rewrite data during other times such that the non-volatile memory device operates in a synchronous manner for read and write operations from the controller.

8. The apparatus of claim 1, wherein the non-volatile memory device is configured to receive the refresh command periodically from the controller.

9. The apparatus of claim 8, wherein the non-volatile memory device is configured to selectively skip rewriting subsequent data in response to one of the periodically received refresh commands in response to an error metric for the subsequent data failing to satisfy the error threshold.

10. The apparatus of claim 1, wherein the bus comprises a host memory bus of a host processor, the controller comprises a double data rate volatile memory controller for the host processor, and the non-volatile memory device comprises a non-volatile dual inline memory module compatible with a volatile dual inline memory module memory socket.

11. The apparatus of claim 1, wherein the non-volatile memory device comprises ovonic threshold switch ("OTS") selectors for the non-volatile memory medium and spikes in electrical current from the OTS selectors turning on causes accumulating errors in the data until the error metric satisfies the error threshold.

12. A method comprising:
reading data from a region of a non-volatile memory;
correcting errors in the read data;
buffering the error corrected read data in response to the number of corrected errors satisfying an error threshold; and
writing the buffered error corrected read data back to the same region of the non-volatile memory in response to receiving a refresh command at the non-volatile memory from a controller over a bus,
wherein current spikes from ovonic threshold switch ("OTS") selectors for the non-volatile memory turning on for memory operations cause accumulating errors in the data of the non-volatile memory until the number of corrected errors satisfies the error threshold and the data is written back to the same region of the non-volatile memory.

13. The method of claim 12, further comprising:
reading the rewritten data from the same region of the non-volatile memory;
correcting errors in the read rewritten data;
buffering the error corrected read rewritten data in response to the number of corrected errors in the read rewritten data satisfying the error threshold; and
writing the buffered error corrected read rewritten data back to a different region of the non-volatile memory in response to receiving a subsequent refresh command at the non-volatile memory from the controller over the bus.

14. The method of claim 12, further comprising shifting the buffered error corrected read data for writing back to shifted locations within the same region of the non-volatile memory.

15. The method of claim 12, further comprising synchronously executing read operations from the non-volatile memory between a predefined time period after the refresh command and receiving a subsequent refresh command.

16. The method of claim 12, wherein the region comprises an error correcting code ("ECC") code word of the non-volatile memory.

17. An apparatus comprising:
means for periodically receiving refresh triggers at a non-volatile memory over a bus;
means for determining an error metric for an error correcting code ("ECC") codeword in response to a read request for the ECC codeword; and
means for selectively rewriting the ECC codeword to the non-volatile memory exclusively during a refresh window of a next refresh trigger of the refresh triggers in response to the error metric satisfying an error threshold, wherein the means for selectively rewriting the ECC codeword to the non-volatile memory rewrites the ECC codeword to the same memory block in response to receiving the next refresh trigger and rewrites the ECC codeword to a different memory block in response to receiving a subsequent refresh trigger of the refresh triggers.

18. The apparatus of claim 17, further comprising means for synchronously satisfying read requests between the refresh window for the next refresh trigger and subsequent refresh triggers of the refresh triggers.

* * * * *